United States Patent
Oh et al.

(10) Patent No.: US 10,978,133 B2
(45) Date of Patent: Apr. 13, 2021

(54) MEMORY DEVICE AND MEMORY SYSTEM COMPRISING THE SAME

(71) Applicant: Samsung Electronics Co., Ltd., Suwon-si (KR)

(72) Inventors: Jihyuk Oh, Suwon-si (KR); Youngjin Park, Incheon (KR); Byoungjik Kim, Hwaseong-si (KR); Kiseok Park, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/813,962

(22) Filed: Mar. 10, 2020

(65) Prior Publication Data

US 2021/0012831 A1  Jan. 14, 2021

(30) Foreign Application Priority Data

Jul. 11, 2019  (KR) .......................... 10-2019-0083795

(51) Int. Cl.
| | | |
|---|---|---|
| *G11C 11/406* | (2006.01) | |
| *G11C 29/44* | (2006.01) | |
| *G11C 11/4093* | (2006.01) | |
| *G11C 29/14* | (2006.01) | |
| *G11C 11/4076* | (2006.01) | |

(52) U.S. Cl.
CPC .... *G11C 11/40607* (2013.01); *G11C 11/4076* (2013.01); *G11C 11/4093* (2013.01); *G11C 11/40615* (2013.01); *G11C 29/14* (2013.01); *G11C 29/44* (2013.01)

(58) Field of Classification Search
None
See application file for complete search history.

(56) References Cited

U.S. PATENT DOCUMENTS

| | | | |
|---|---|---|---|
| 6,804,158 B2 | 10/2004 | Ooishi | |
| 7,058,756 B2 | 6/2006 | Park | |
| 8,750,068 B2 | 6/2014 | Cho | |
| 9,891,865 B2 | 2/2018 | Lee | |
| 2009/0109783 A1* | 4/2009 | Lee .................. | G11C 11/40615 365/222 |
| 2011/0004805 A1* | 1/2011 | Seo .................. | G11C 11/40622 714/763 |
| 2014/0281577 A1 | 9/2014 | Nicholes | |

(Continued)

FOREIGN PATENT DOCUMENTS

| | | |
|---|---|---|
| JP | 2011065686 A | 3/2011 |
| KR | 1020170139438 A | 12/2017 |
| WO | 2010100685 A1 | 9/2010 |

*Primary Examiner* — James G Norman
(74) *Attorney, Agent, or Firm* — Muir Patent Law, PLLC

(57) ABSTRACT

A memory device includes a plurality of memory chips for writing and reading data in response to a control command and an address signal, and a control logic circuit for transferring the control command and the address signal to the plurality of the memory chips, and receiving a first command from a memory controller to perform a first operation, different from a refresh operation, on at least one of a plurality of the memory chips. The control logic circuit, in response to a refresh command, transmits the first command to at least one of a plurality of the memory chips and performs the first operation during a pre-determined refresh time interval without carrying out the refresh operation.

20 Claims, 23 Drawing Sheets

(56) References Cited

U.S. PATENT DOCUMENTS

| | | |
|---|---|---|
| 2017/0147411 A1 | 5/2017 | Kobori |
| 2017/0357604 A1 | 12/2017 | Lim et al. |
| 2018/0181504 A1 | 6/2018 | Morris et al. |
| 2019/0107961 A1 | 4/2019 | Lee |
| 2019/0115053 A1 | 4/2019 | Park et al. |

* cited by examiner

US 10,978,133 B2

MEMORY DEVICE AND MEMORY SYSTEM COMPRISING THE SAME

CROSS-REFERENCE TO RELATED APPLICATION

This application claims benefit of priority to Korean Patent Application No. 10-2019-0083795 filed on Jul. 11, 2019, in the Korean Intellectual Property Office, the disclosure of which is incorporated herein by reference in its entirety.

BACKGROUND

1. Field

The present disclosure relates to a memory device and a memory system including the same.

2. Description of Related Art

A memory device includes a plurality of memory chips capable of writing and reading data, and is applied to various applications, such as personal computers, mobile electronic devices, servers, databases, and the like.

A memory device has special command modes predefined inside the device by manufacturers or defined by standards. To achieve such special command modes, it is necessary to apply the special commands to the memory device. Since special commands cannot be applied to the memory device in a run-time environment, however, there is a limitation that an initialization process must be re-performed through a system reboot.

SUMMARY

An aspect of the present disclosure is to provide a memory device capable of performing a first operation requested by a host without rebooting a system in a run-time environment.

According to an aspect of the present disclosure, a memory device includes a plurality of memory chips configured to write and read data in response to a control command and an address signal, and a control logic circuit configured to transfer the control command and the address signal to the plurality of the memory chips, and receive a first command from a memory controller to perform a first operation, different from a refresh operation, on at least one of a plurality of the memory chips. The control logic circuit, in response to a refresh command, transmits the first command to at least one of a plurality of the memory chips and performs the first operation during a pre-determined refresh time interval without carrying out the refresh operation.

According to an aspect of the present disclosure, a memory device comprises a plurality of memory chips including a plurality of memory cells connected to a plurality of row lines and a plurality of column lines, and a control logic circuit configured to transmit a first command for performing a first operation of inputting/outputting data for the plurality of the memory cells in a first state and perform a second operation of repairing at least one defective memory cell among the plurality of the memory cells in a second state. The control logic circuit, in the first state, receives a second command for carrying out the second operation from a memory controller and, in the second state, transmits the first command to the plurality of the memory chips.

According to an aspect of the present disclosure, a memory device includes a plurality of memory chips, and a control logic circuit comprising a status register configured to save status information indicating whether the RCD buffer is in a state to receive a first command, a register clock driver (RCD) buffer configured to save the first command according to the status information of the status register, and a refresh controller configured to control a self-refresh operation for a plurality of the memory chips. The control logic circuit performs a first operation of the first command on at least one of the plurality of the memory chips during at least one interval of a plurality of refresh periods according to the self-refresh operation.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
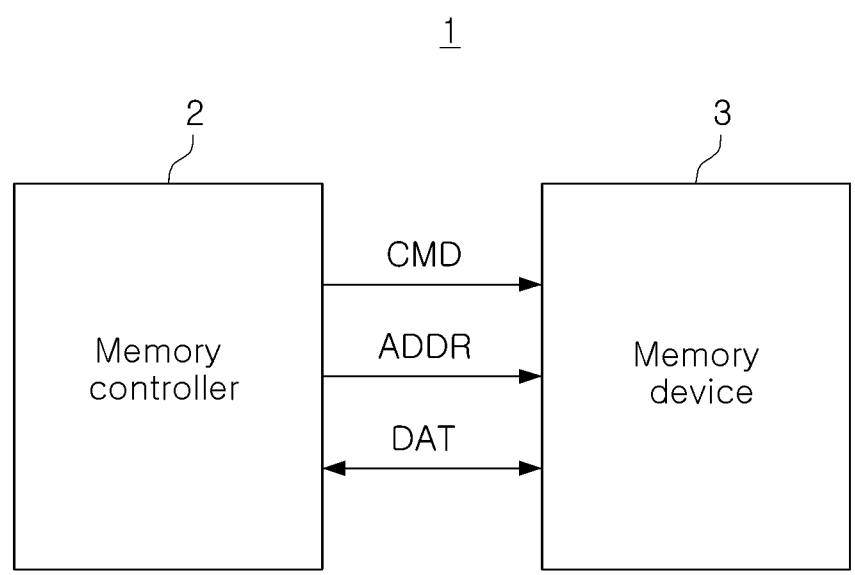
FIG. 1 is a diagram simply illustrating a constitution of a memory system according to an exemplary embodiment of the present disclosure.

Hereinafter, example embodiments of the present disclosure will be described with reference to the accompanying drawings. The same reference numerals are used throughout the drawings to refer to the same parts in the drawings, and detailed descriptions thereof will be omitted.

FIG. 1 is a diagram illustrating a constitution of a memory system according to an exemplary embodiment of the present disclosure.

Referring to FIG. 1, a memory system 1 according to an exemplary embodiment of the present disclosure may include a memory controller 2 and a memory device 3.

The memory controller 2 controls overall operations of the memory system 1 and a data (DAT) exchange between a host and the memory device 3. For example, the memory controller 2 may control the memory device 3 according to a request from the host to perform a data (DAT) writing and/or reading operation. To this end, the memory controller 2 may control the operation of the memory device 3 by transmitting an operational command (CMD) and an address signal (ADDR).

The memory device 3 may save (i.e., store) data received from the memory controller 2. The memory device 3 may include low power double data rate 2 (LPDDR2) synchronous dynamic random access memory (SDRAM), double data rate 3 (DDR3) SDRAM, and the like.

The memory controller 2 may perform a refresh operation in units of pre-determined numbers of all memory cells. For example, the memory device 3 may perform a refresh operation for every memory cell. Alternatively, the memory device 3 may perform a refresh operation every two, four or eight memory cells.

In an exemplary embodiment, the memory device 3 may receive a refresh (REF) command from the memory controller 2 and perform a refresh operation. The memory controller 2 may transmit a REF command to the memory device 3 for each refresh operation. For example, when the memory device 3 carries out a refresh operation for each memory cell, the memory controller 2 may transmit a refresh command (REF1-REFn) for each memory cell. In an exemplary embodiment, in response to the REF command from the memory controller 2, the memory device 3 may perform a refresh operation on a row of the memory cells or simultaneously perform two or more rows of the memory cells in response to the REF command.

In an exemplary embodiment, the memory device 3 may perform a self-refresh operation using an internal clock. In this case, a refresh controller included in the memory device 3 may create a self-refresh initiation command (SREF) and a self-refresh termination command (SREFX). The memory controller 2 may wait for a maximum time necessary for the self-refresh termination and transmit an operational command (CMD) and a special command to the memory device 3.

A refresh time interval (tRFC) required for completion of each refresh operation may vary depending on a type and an amount of the memory device 3. For example, when the memory device 3 is an 8 Gb LPDDR2 SDRAM, the refresh time interval (tRFC) may be 210 ns, whereas when the memory device 3 is an 8 Gb DDR SDRAM, the refresh time interval (tRFC) may be 350 ns.

Meanwhile, in order to carry out a special operation, the memory device 3 may receive the special command from the memory controller 2 and execute the same during at least one refresh time interval (tRFC). The special operation is an operation other than a basic operation such as data writing and/or reading operation and may include a test operation using a test mode register set (TMRS), a soft post package repair (SPPR) defined by Joint Electron Device Engineering Council (JEDEC) standards, and the like.

It is general that in order to carry out the special operation, the memory controller 2 transmits the special command to the memory device 3 during system initialization. In this case, there is a limitation that a system reboot is required to perform the special operation in a run-time environment of a memory system 1. To solve such problem, the memory system 1 according to an exemplary embodiment may save the special command in the memory device 3 in the run-time environment and execute the saved special command during at least one time interval (tRFC), thereby reducing a time period to carry out the special operation.

Figure 2:
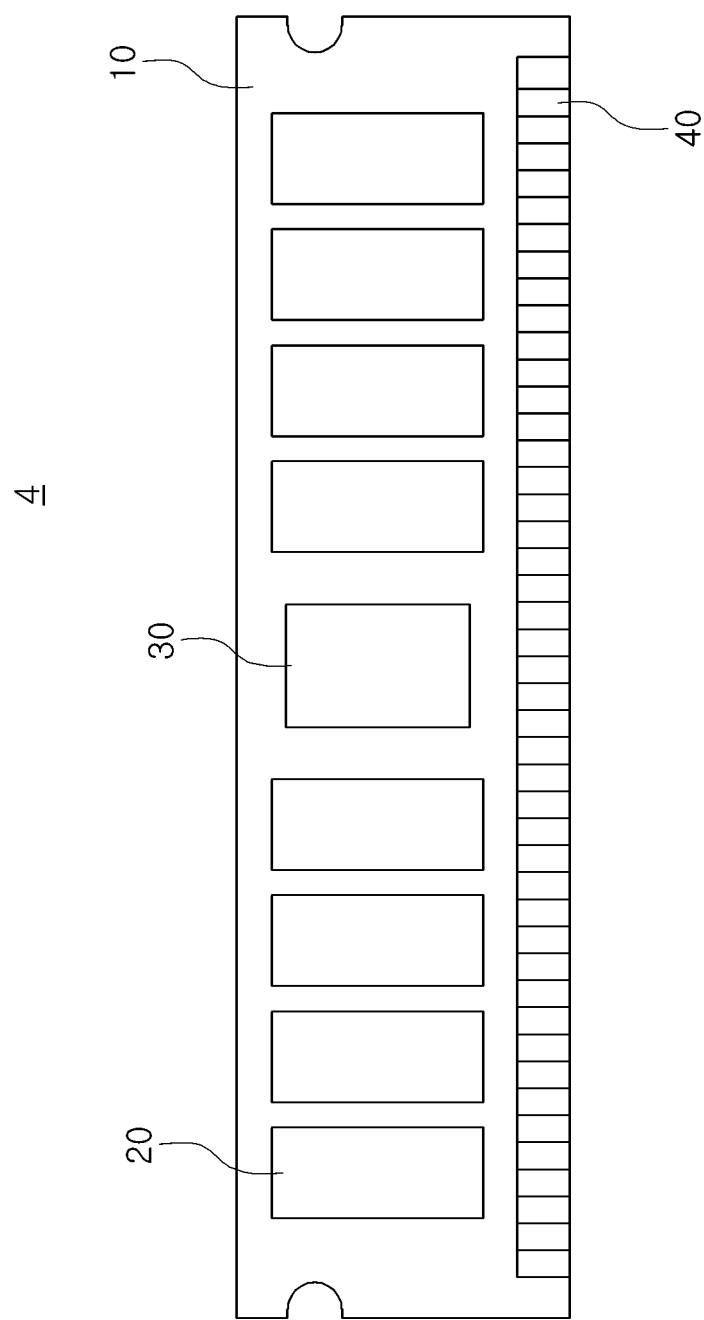
FIGS. 2 and 3 are diagrams illustrating a memory device according to an exemplary embodiment.
Figure 3:
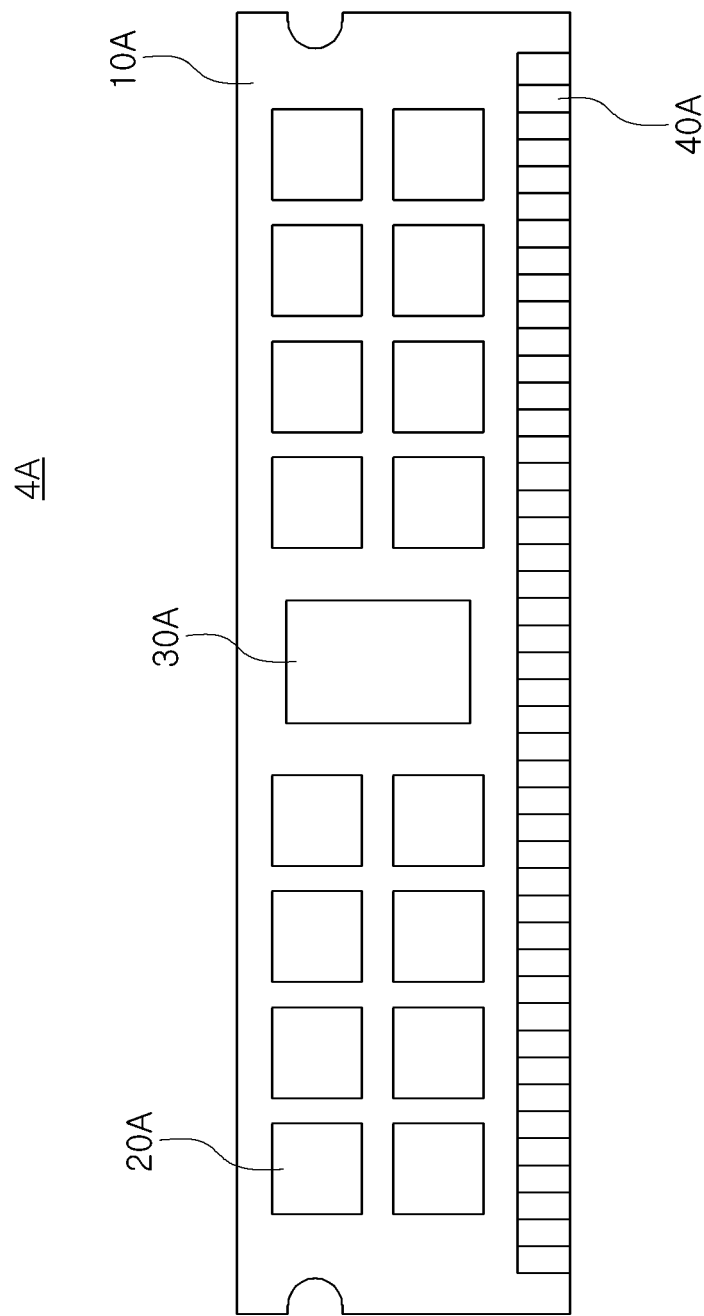

FIGS. 2 and 3 are diagrams illustrating a memory device according to an exemplary embodiment.

Referring to FIG. 2, a memory device 4 according to an exemplary embodiment may include a plurality of memory chips 20 mounted on a substrate 10. Some of a plurality of the memory chips 20 may be provided as memory chips having an error check correction (ECC) function for the data stored and/or output by a plurality of the memory chips 20.

The memory device 4 may further include a control logic 30 transferring a control command, an address signal, and the like, to a plurality of the memory chips 20 and input/output pads 40 disposed at an end of the substrate 10.

The control logic 30 may store a special command received from an external source in a run-time environment and execute the saved special command during a certain refresh time interval (tRFC) to control the special operation for the memory device 4. In an exemplary embodiment, the control logic 30 may include a register clock driver (RCD). In an exemplary embodiment, the control logic 30 may include an RCD buffer for saving a special command and a command scheduler for controlling the execution of the special command.

The input/output pads 40 may be connected to data input/output (DQ) paths of each of the memory chips 20.

Meanwhile, the memory device 4 including 8 memory chips 20 is illustrated in FIG. 2, but is merely an example; therefore, the exemplary embodiments of the present disclosure are not limited thereto. For example, a memory device 4A of an exemplary embodiment illustrated in FIG. 3 may include 16 memory chips 20A. The input/output pads 40A may be connected to data input/output (DQ) paths of each of the memory chips 20A. When the memory devices 4 and 4A illustrated in FIGS. 2 and 3 have the same storage capacity, the storage capacity of each of the memory chips 20 illustrated in FIG. 2 may be twice larger than that of each of the memory chips 20A illustrated in FIG. 3. Further, a number of the data input/output (DQ) paths connected to the memory chips 20 illustrated in FIG. 2 may also be twice larger than that of the memory chips 20A illustrated in FIG. 3.

Figure 4:
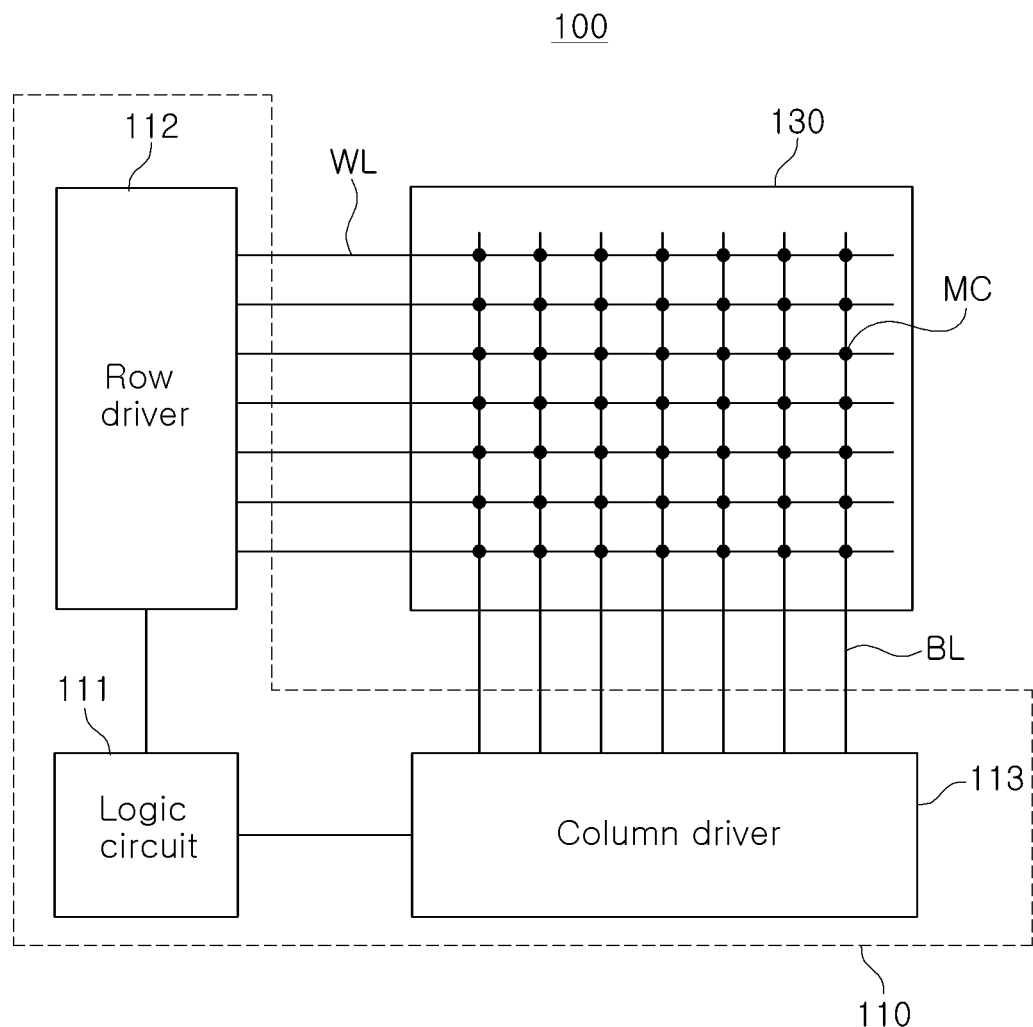
FIG. 4 is a block diagram simply illustrating a memory chip according to an exemplary embodiment.

FIG. 4 is a block diagram simply illustrating a memory chip according to an exemplary embodiment.

FIG. 4 may be a block diagram illustrating an internal structure of a memory chip included in a memory device according to an exemplary embodiment. The memory chip 100 illustrated in FIG. 4 may be an example memory chip of the plurality of the memory chips 20 and 20A included in the memory devices 4 and 4A illustrated in FIGS. 2 and 3. Based on FIG. 4, the memory chip 100 may include a controller 110 and a bank array 130. In an exemplary embodiment, the controller 110 may include a control logic 111, a row driver 112, a column driver 113, and the like. The bank array 130 may include a plurality of memory cells (MC).

In an exemplary embodiment, the row driver 112 may be connected to the memory cells (MC) via word lines (WL), and the column driver 113 may be connected to the memory cells (MC) via bit lines (BL). In an exemplary embodiment, the row driver 112 may select memory cells (MC) for recording or reading data, and the column driver 113 may include a reading/writing circuit for writing the data in the memory cells (MC) or reading the data from the memory cells (MC). Operations of the row driver 112 and the column driver 113 may be controlled by the control logic 111.

Figure 5:
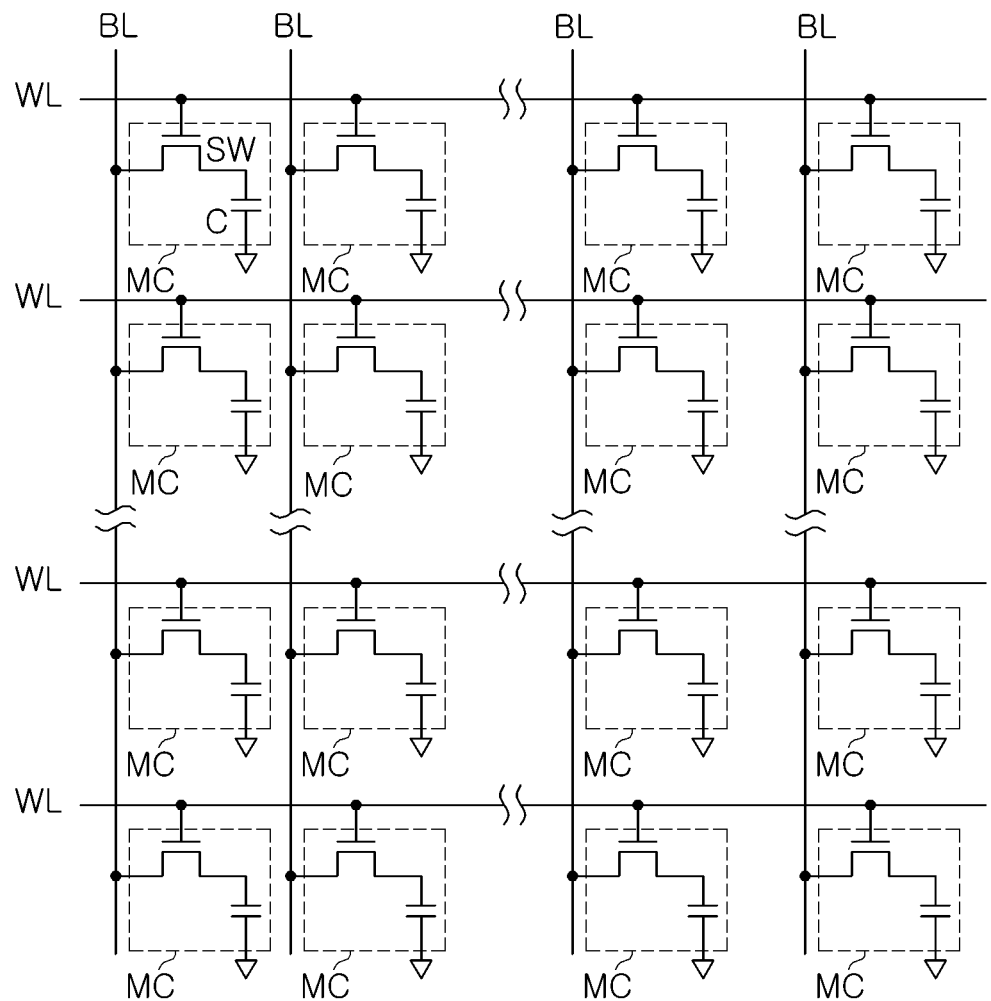
FIG. 5 is a diagram illustrating a bank array included in a memory chip according to an exemplary embodiment.

FIG. 5 is a diagram illustrating a bank array included in a memory chip according to an exemplary embodiment.

Referring to FIG. 5, the bank array 130 of FIG. 4 according to an exemplary embodiment may include a plurality of memory cells (MC). The memory cells (MC) may be provided at a point at which a plurality of word lines (WL) and a plurality of bit lines (BL) intersect each other. That is, each of the memory cells (MC) may be connected to a single word line (WL) and a single bit line (BL).

Each of the memory cells (MC) may include a switch element SW and a storage capacitor (C). In an exemplary embodiment, the switch element SW may include a transistor, and a gate terminal of the transistor may be connected to the word lines (WL), and drain/source terminals of the transistor may be connected to the bit lines (BL) and the storage capacitor (C), respectively.

A control logic included in the memory chip may charge electric charges to the storage capacitor (C) included in each of a plurality of the memory cells (MC), via the plurality of the word lines (WL) and the plurality of the bit lines (BL), or may discharge the electric charges charged in the storage capacitor (C) to write or erase data thereto or therefrom. Further, the control logic may read data from each of a plurality of the memory cells (MC) by reading a voltage of the storage capacitor (C) and the like.

The memory controller 2 may perform a refresh operation of re-writing data to a plurality of the memory cells (MC) such that the data is not lost due to naturally discharged electric charges, which have been charged in the storage capacitor (C). The control logic may receive a refresh command (REF) from an external source or use an internal clock without an external command to perform a refresh operation.

In an exemplary embodiment, a control logic may receive and store a special command from the outside and perform the stored special command during at least one refresh time interval (tRFC) to perform the special operation, such as a test operation or a soft post package repair (SPPR) operation, in a run-time environment.

Figure 6:
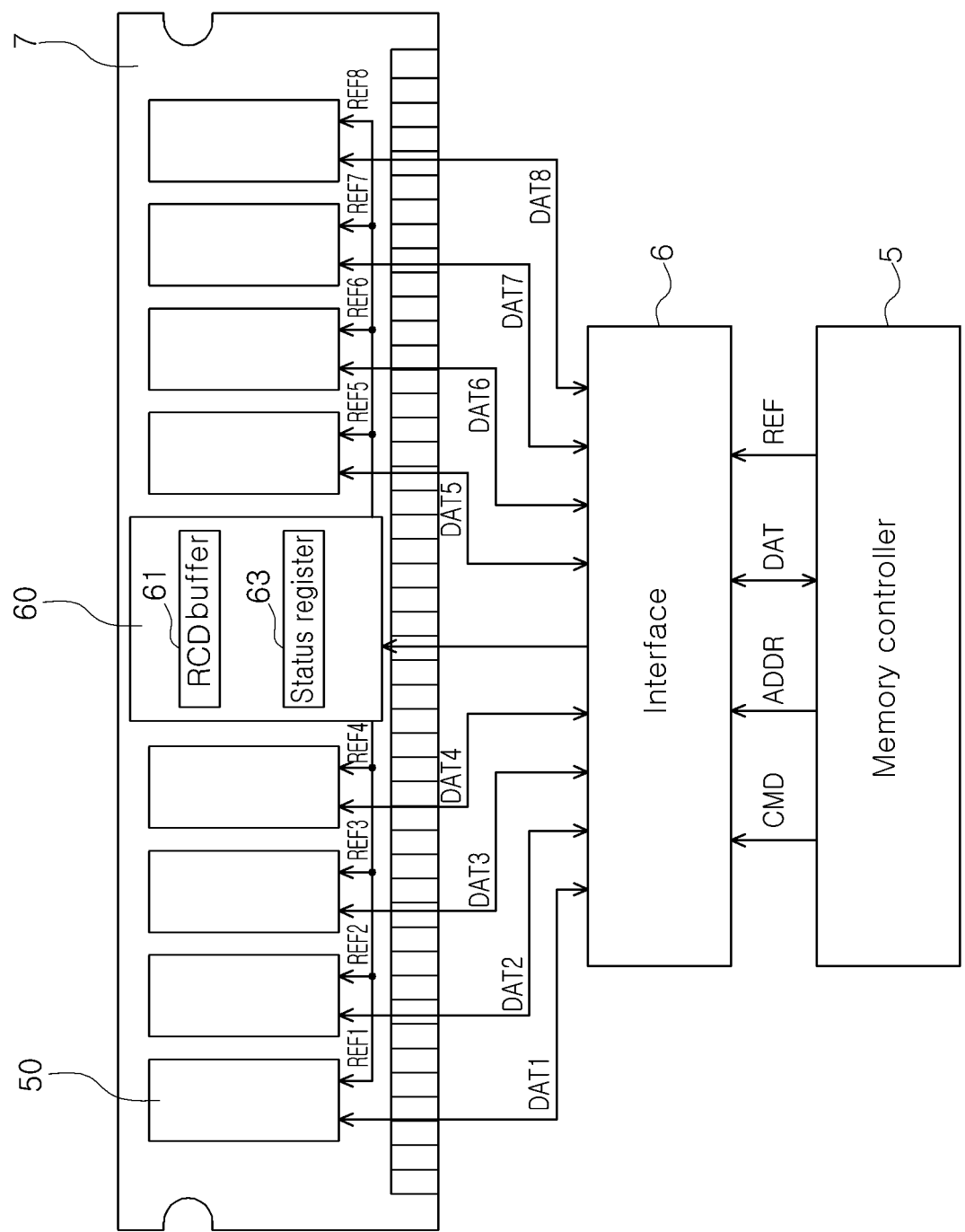
FIGS. 6, 7, 8A to 8B are diagrams illustrating a memory device according to an exemplary embodiment.
Figure 7:
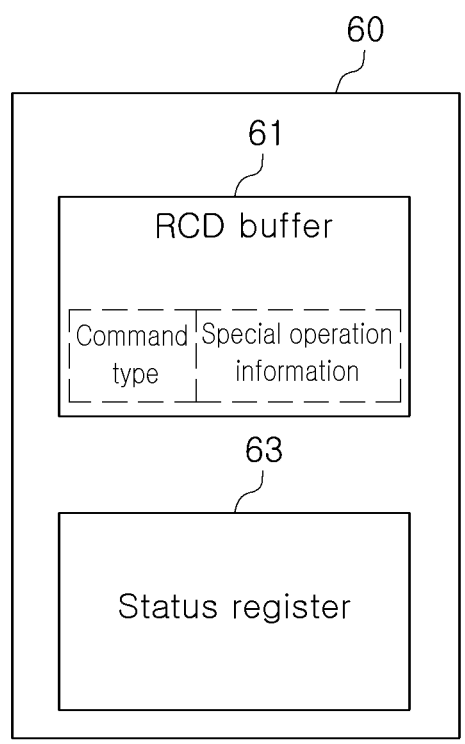

FIG. 6 is a diagram illustrating a memory device according to an exemplary embodiment, and FIG. 7 is a diagram illustrating a constitution of a control logic included in a memory device according to an exemplary embodiment.

Figure 8A:
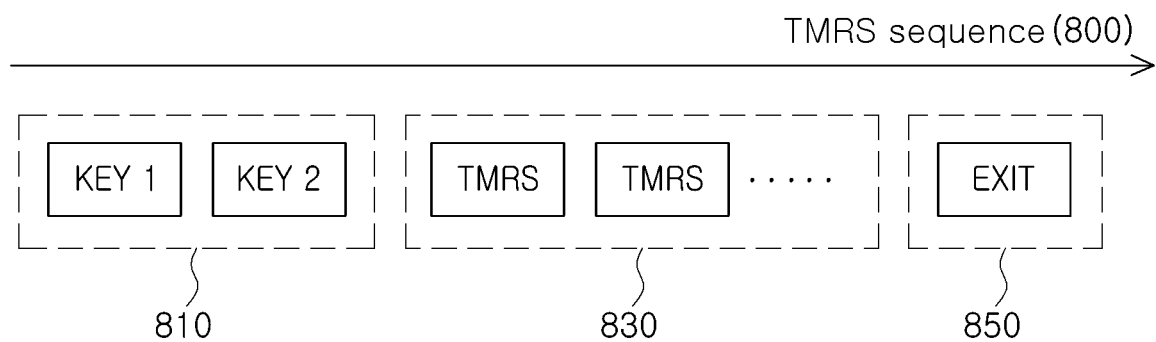
Figure 8B:
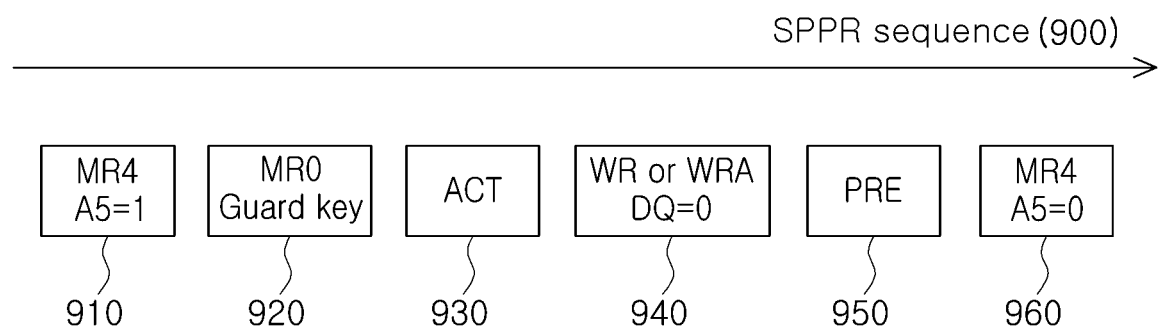

FIGS. 8A and 8B are diagrams schematically illustrating flows of executions of special commands in a memory device according to an exemplary embodiment.

Referring to both FIGS. 6 and 7, a memory controller 5 may access to a memory device 7 through an interface 6. For example, the memory controller 5 may transmit an operational command (CMD) and an address signal (ADDR) to the memory device 7 through the interface 6. Further, the memory controller 5 may exchange various types of data (DAT) with the memory device 7 through the interface 6.

The memory device 7 may include a plurality of memory chips 50 and a control logic 60. The control logic 60 may transfer the operational command (CMD) and the address signal (ADDR) received from the memory controller 5 to the plurality of the memory chips 50 to control a data writing and/or data reading operation. In addition, the control logic 60 may transfer a refresh command (REF) received from the memory controller 5 to a plurality of the memory chips 50 to control a refresh operation.

The control logic 60 may include a register clock driver (RCD). In an exemplary embodiment, the control logic 60 may include an RCD buffer 61 for saving a special command received from the memory controller 5 and a status register 63 having status information of the control logic 60.

A special operation and a type of a special command received from the memory controller 5 may be saved in the RCD buffer 61. For example, when the special command is a test mode register set (TMRS) sequence, the command type information of the special command may be saved in a first storage of the RCD buffer 61 while test data utilized in the test operation may be saved in a second storage of the RCD buffer 61. Further, when the special command is a soft post package repair (SPPR) sequence, the command type information of the special command may be saved in the first storage of the RCD buffer 61 while address information of the memory chip performing the soft post package repair (SPPR) operation may be saved in the second storage of the RCD buffer 61. Meanwhile, referring to FIG. 8A, a test mode register set (TMRS) sequence 800 may include safety key information 810 for verification of sequence efficacy, test mode register sets 830 and a sequence termination command 850, which may be transferred to the memory device in that order. Further, referring to FIG. 8B, a soft post package repair (SPPR) sequence 900 may include a sequence initiation command 910, guard key information for verification of sequence efficacy 920, an activation command 930, a writing command 940, a free patch command 950 and a sequence termination command 960, which may be transferred to the memory device in that order.

A size of the RCD buffer 61 may vary depending on a type of the special command received from the memory controller 5. For example, when the special command is the test mode register set (TMRS) sequence, the size of the RCD buffer 61 may be 4 bytes. When the special command is the soft post package repair (SPPR) sequence, the size of the RCD buffer 61 may be 11 bytes. Such saving format and size of the RCD buffer 61, however, are merely an example, and thus are not limited thereto. For example, the control logic 60 may save information regarding the special operation, except for the special command type, in the RCD buffer 61. In this case, the type of the special command may be determined based on the size of the RCD buffer 61.

The status register 63 may save a value indicating whether or not the control logic 60 may be in a state capable of receiving a special command. For example, when the control logic 60 is in a first state (e.g., the value of the status register 63 may be 1), the control logic 60 may receive a special command, whereas when the control logic 60 is in a second state (e.g., the value of the status register may be 0), the control logic 60 may be unable to receive the special command. The memory controller 5 may determine whether to transmit the special command to the memory device 7 by verifying the value of the status register 63 through the interface 6. Meanwhile, in the case of saving a special command in the RCD buffer 61, the control logic 60 may block receipt of other special commands by changing the value of the status register 63 to 0.

The interface 6 may be designed to be able to access to the status register 63 and the RCD buffer 61 of the memory device, and in some examples, may include system management bus (SMBus), and the like.

Figure 9:
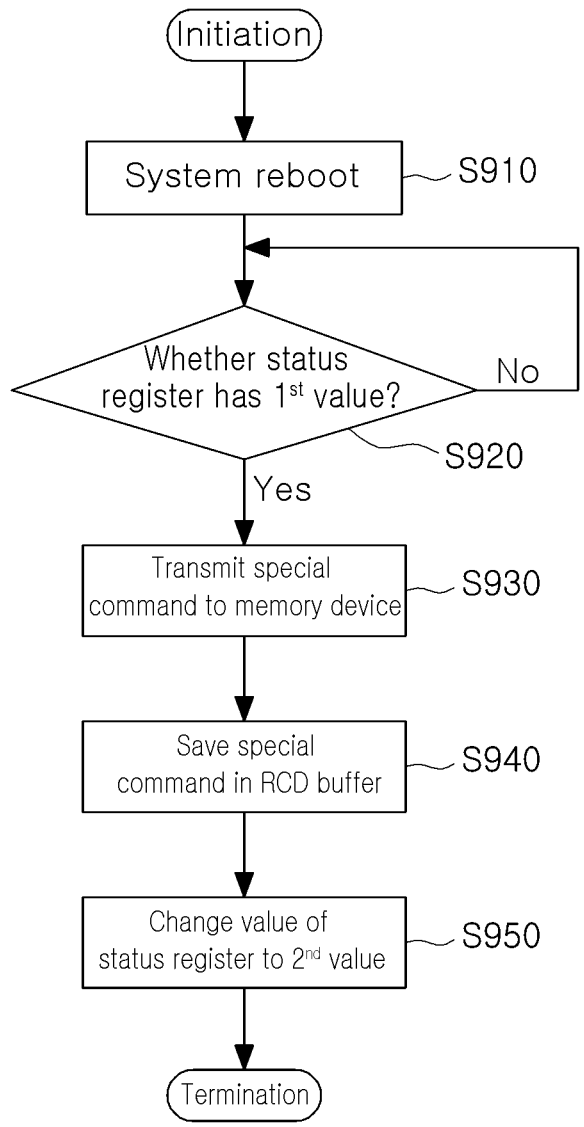
FIGS. 9, 10A to 10B are diagrams illustrating a method of a memory device according to an exemplary embodiment for saving a special command.
Figure 10A:
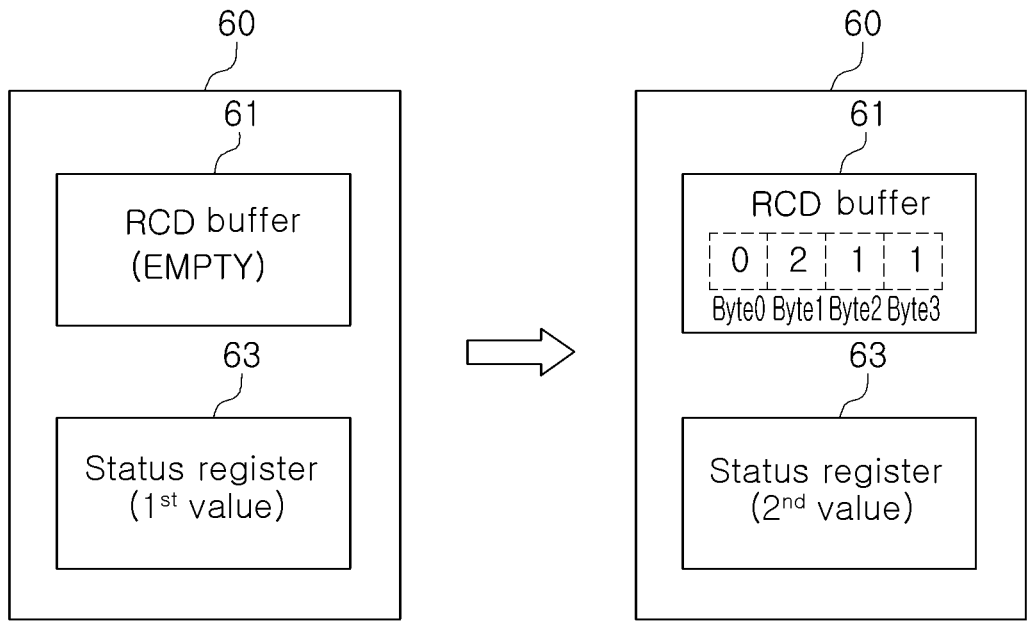
Figure 10B:
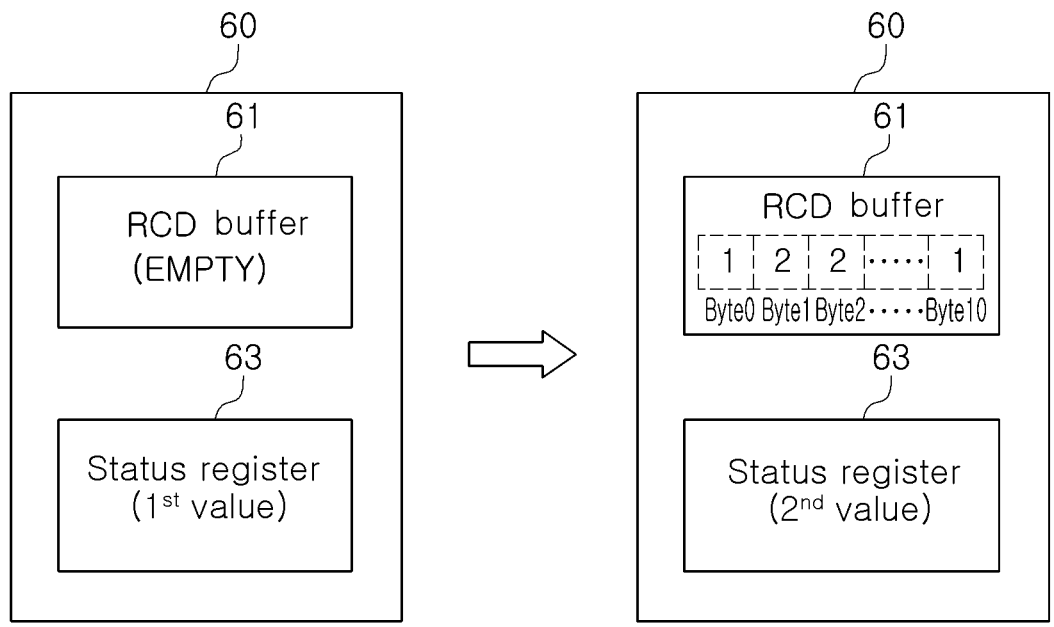

FIGS. 9, 10A to 10B are diagrams illustrating a method of a memory device according to an exemplary embodiment for storing a special command.

Referring to FIG. 9 together with FIG. 6 for convenience of description, the memory device 7 according to an exemplary embodiment may initiate an operation when the system in which the memory device 7 is built in is rebooted and begins to operate S910. The system may be a computer, a server, a database, a mobile electronic device, or the like, in which the memory device 7 is built in, and by a system reboot of S910, an operation system installed in the system may be run.

Once the system is rebooted, the memory controller 5 may determine whether the value of the status register 63 is a first value representing the first state, in which the control logic 60 may receive a special command (S920). The memory controller 5 may determine whether the or not control logic 60 is in the first state by identifying the value of the status register 63 through a pre-determined interface 6.

When a result of the verification in S920 indicates that the control logic 60 is in the first state, the memory controller 5 may transmit the special command to the memory device 7 (S930).

When a result of the determination in S920 indicates that the control logic 60 is not in the first state, the memory controller 5 returns to S920 and continues to verify whether the control logic 60 is in the first state.

In S940, the memory device 7 may save a special command received from the memory controller 5 in the RCD buffer 61. In an exemplary embodiment, the memory device 7 may save information of a special operation and a type of the special command in the RCD buffer. In an exemplary embodiment, the memory device 7 may dynamically vary a size of the RCD buffer 61 according to the type of the special command. For example, when the received special command is a test mode register set (TMRS) sequence, the memory device 7 may set the size of the RCD buffer 61 to 4 bytes. When the received special command is a soft post package repair (SPPR) sequence, the memory device 7 may set the size of the RCD buffer 61 to 11 bytes.

Once a special command is saved in the RCD buffer 61, the control logic 60 may change the value of the status register 63 to a second value representing a second state, in which the control logic 60 may not receive a special command (S950). When the control logic 60 is in the second state, the memory controller 5 may not transmit other special commands to the memory device 7.

State changes of the RCD buffer 61 and the status register 63 before and after the memory device 7 receives and saves a special command are as shown in FIGS. 10A and 10B. FIG. 10A may correspond an exemplary embodiment in which the special command is a test mode register set (TMRS) sequence, while FIG. 10B may correspond to an exemplary embodiment in which the special command is a soft post package repair (SPPR) sequence.

Referring to FIG. 10A, before the memory device 7 receives a special command, the RCD buffer 61 may be in an empty state having no saved data and the status register 63 may have a first value indicating the first state, in which a special command may be received. When the memory device 7 receives a test mode register set (TMRS) sequence as the special command, type information indicating the test mode register set (TMRS) sequence may be saved in a first storage (byte 0) of the RCD buffer 61 while test data is saved in a second storage (byte 1-byte 3) of the RCD buffer 61. Further, the status register 63 may have a second value representing the second state, in which other special commands may not be received.

Referring to FIG. 10B, before the memory device 7 receives a special command, the RCD buffer 61 may be in an empty state having no saved data and the status register 63 may have a first value indicating the first state, in which a special command may be received. When the memory device 7 receives a soft post package repair (SPPR) sequence, type information indicating the soft post package repair (SPPR) sequence is saved in the first storage (byte0) of the RCD buffer 61 while address information of the memory chip to perform the soft post package repair (SPPR) operation may be saved in the second storage (byte1-byte10) of the RCD buffer 61. Further, the status register 63 may have a second value representing the second state, in which other special commands may not be received.

Figure 11:
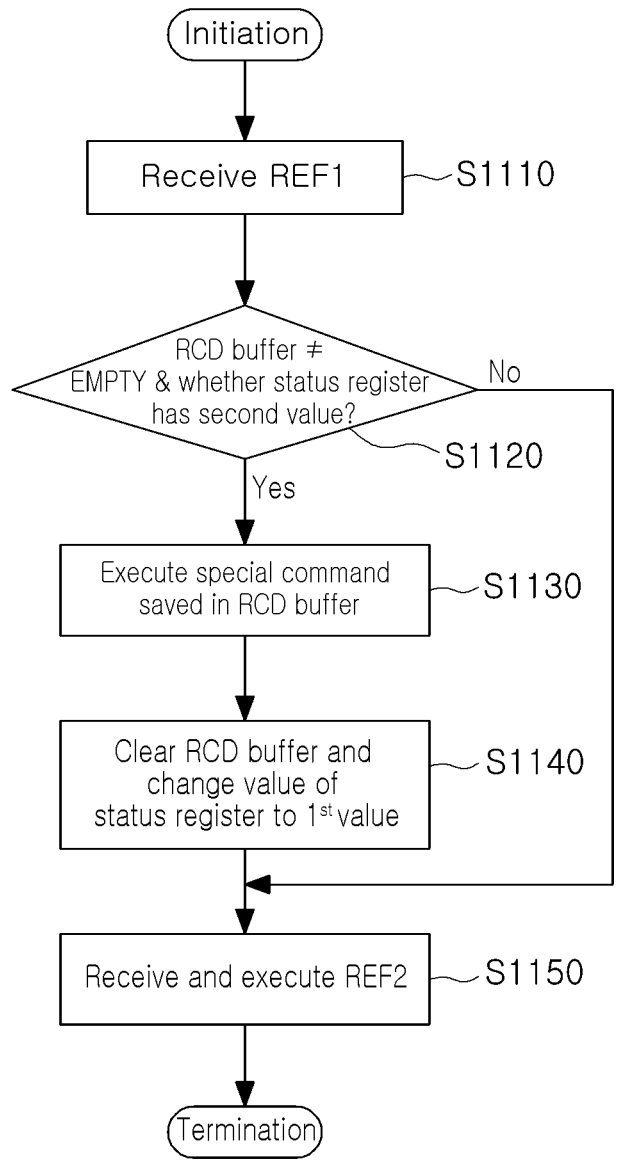
FIGS. 11, 12A to 12B are diagrams illustrating a method of a memory device according to an exemplary embodiment for carrying out a special command.
Figure 12A:
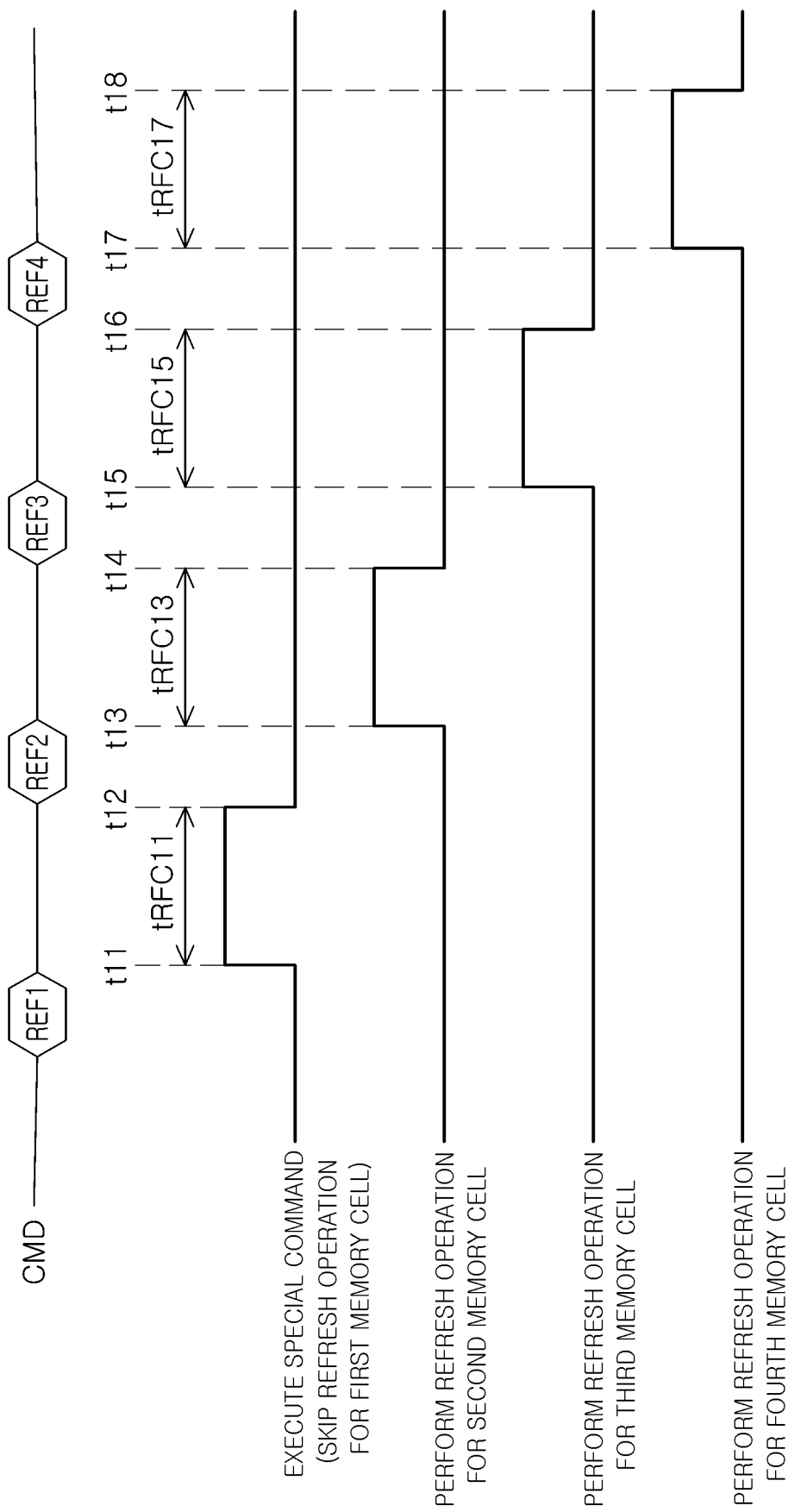
Figure 12B:
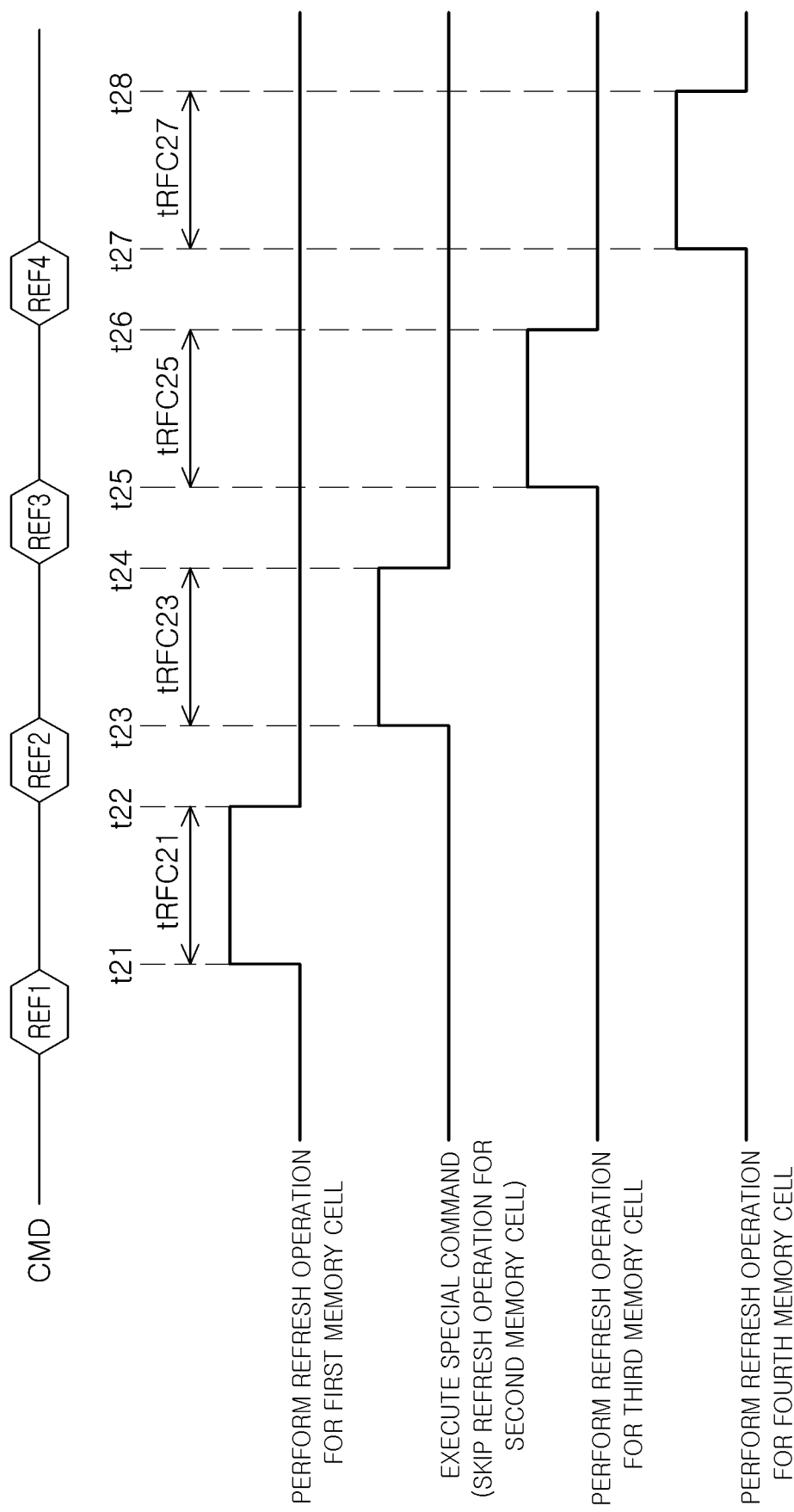

FIGS. 11, 12A to 12B are diagrams illustrating a method of a memory device according to an exemplary embodiment for carrying out a special command.

Referring to FIG. 11 together with FIG. 6 for convenience of description, the memory device 7 may receive a first refresh command (REF1) from the memory controller 5 in S1110. In response to the first refresh command REF1, the memory device 7 may determine whether the control logic 60 is in the second state, in which a special command may not be received, while having the special command saved in the RCD buffer 61 (S1120).

When a result of the verification in S1120 indicates that the status register 63 has the second value representing the second state of the control logic while having the special command saved in the RCD buffer 61, the memory device 7 may transfer the special command saved in the RCD buffer 61 to the memory chip and execute the special command during a refresh time interval (tRFC) according to the first refresh command (REF1) (S1130).

Once the special command is executed, the memory device 7 may remove the already saved special command by clearing the RCD buffer 61 to change the value of the status register 63 to the first value representing the first state of the control logic 60 (S1140).

In S1150, the memory device 7 may then receive a second refresh command (REF2) and accordingly perform the second refresh command.

In an exemplary embodiment, the memory device 7 may skip a refresh operation corresponding to a certain refresh time interval (tRFC), during which the special command has been executed. For example, referring to FIG. 12A, the memory device 7 may execute the special command saved in the RCD buffer 61 during a refresh time interval (an interval between t11 and t12, tRFC11) for the first memory cell. The memory device 7 may then skip the refresh operation for the first memory cell and perform refresh operations for second to fourth memory cells in order. As a time required for the first memory cell till its next refresh operation is performed thereon (i.e., a refresh cycle) is relatively short in consideration of retention characteristics (e.g., data retention time) of the memory device 7, data would not be lost even when the refresh operation for the first memory cell is skipped and the special command is executed.

In an exemplary embodiment, the memory device 7 may perform a special command during a pre-determined refresh time (tRFC) while performing a plurality of refresh operations. For example, referring to FIG. 12B, the memory device 7 may perform the special command saved in the RCD buffer 61 during a refresh time interval (an interval between t23 and t24, tRFC23) for the second memory cell through command scheduling. That is, even when the first refresh command (REF1) is received, the memory device 7 may execute the special command when receiving the second refresh command (REF2) according to pre-determined command scheduling information. Consequently, the memory device 7 may carry out the refresh operation for the first memory cell, skip the refresh operation for the second memory cell and perform the special operation thereon, and carry out the refresh operations for the third and fourth memory cells in order. This prevents data loss which may be resulted from repeatedly skipping a refresh operation for the same memory cell.

Figure 13:
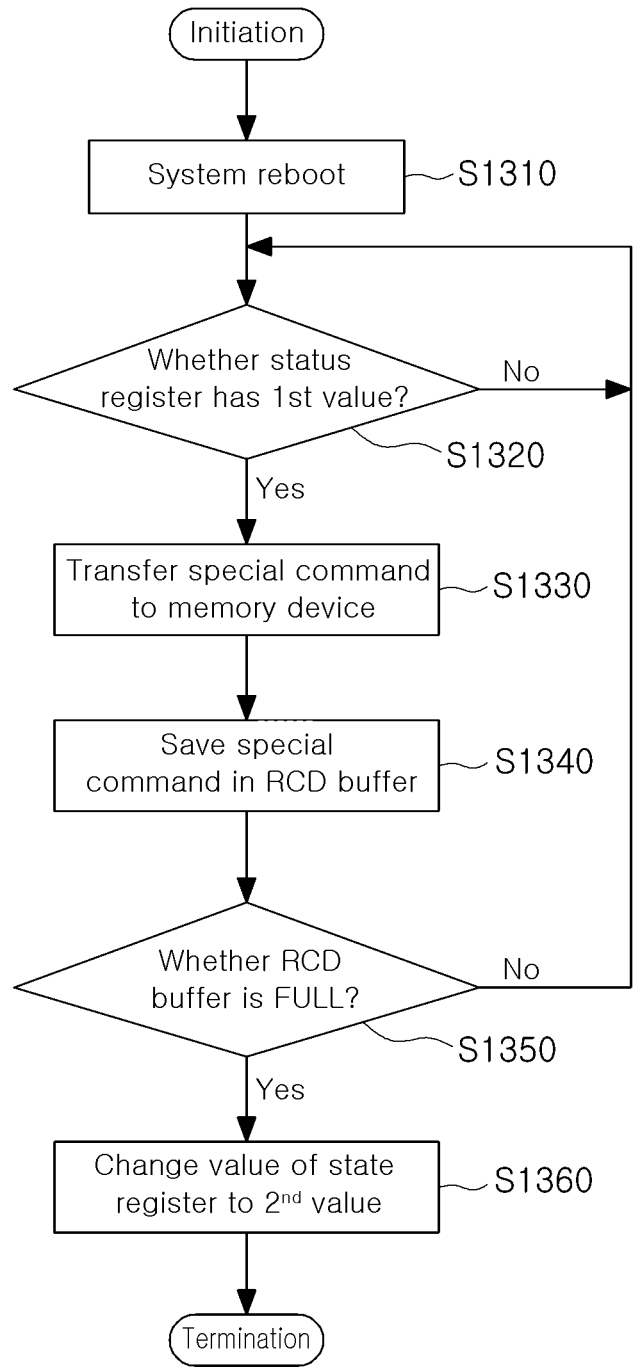
FIGS. 13, 14A to 14B are diagrams illustrating a method of a memory device according to an exemplary embodiment for saving a special command.
Figure 14A:
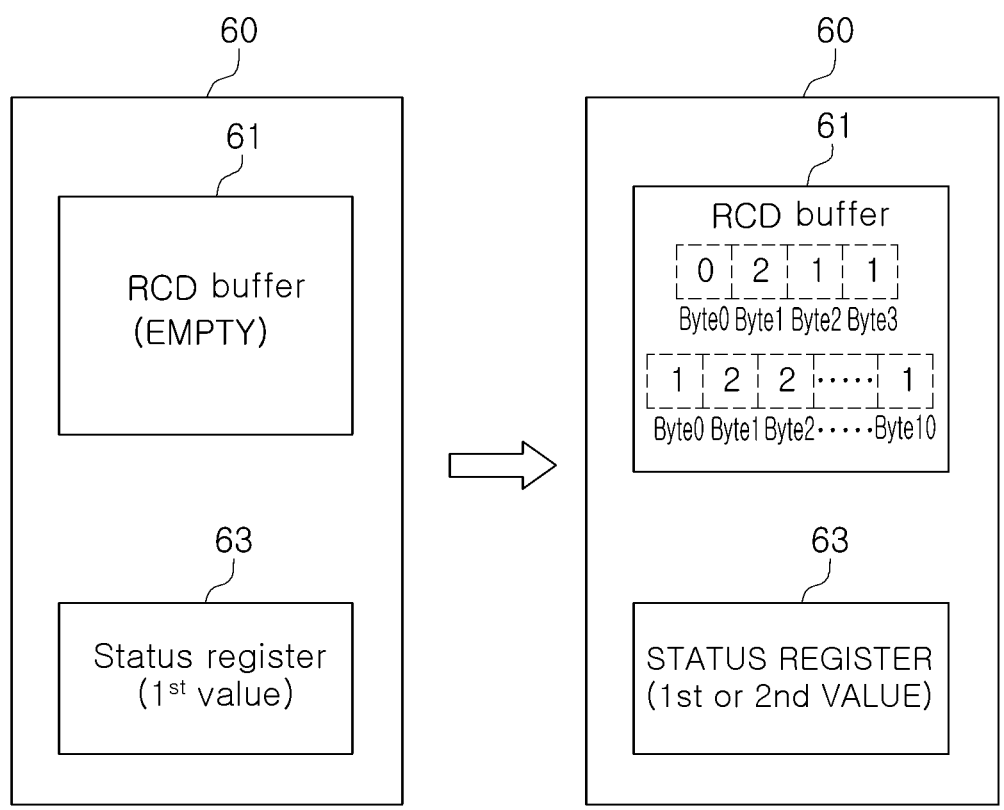
Figure 14B:
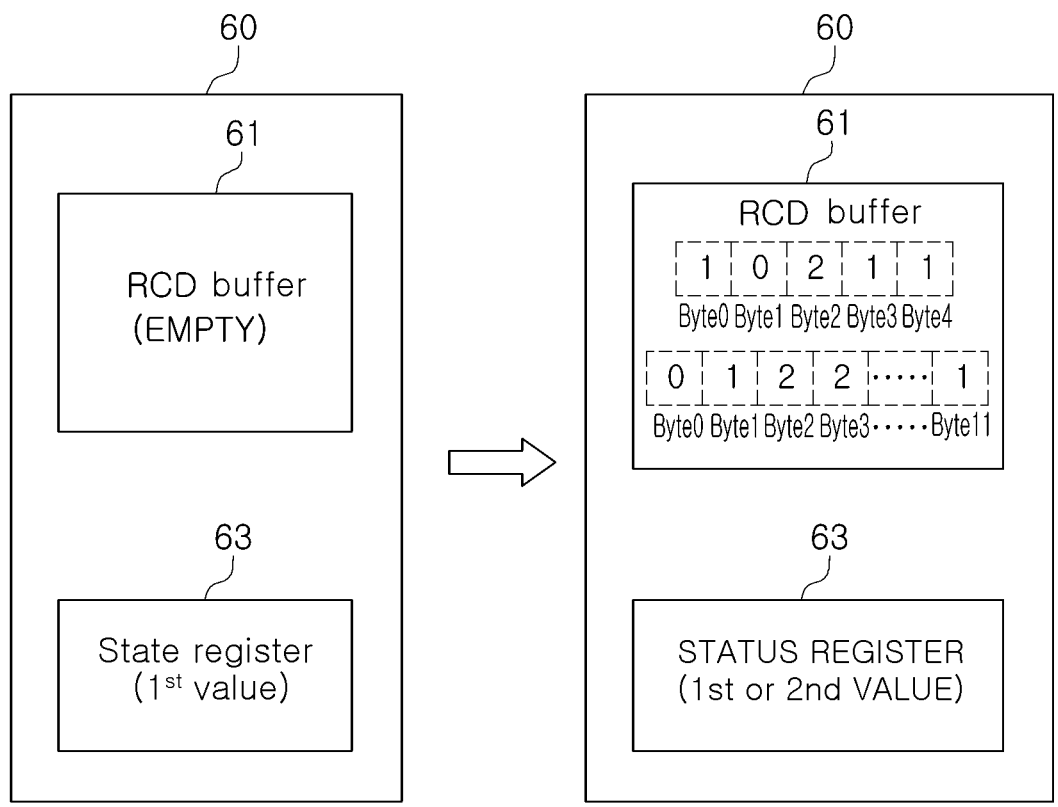

FIGS. 13, 14A to 14B are diagrams illustrating a method of a memory device according to an exemplary embodiment for storing a special command.

Referring to FIG. 13 together with FIG. 6 for convenience of description, an operation of the memory device 7 according to an exemplary embodiment may be initiated by a reboot of a system in which the memory device 7 is built (S1310).

Once the system is booted, the memory controller 5 may verify whether the control logic 60 has the first value representing the first state, in which the control logic 60 may receive a special command (S1320). For example, the memory controller 5 may verify whether the control logic 60 is in the first state by measuring the value of the status register 63 through a pre-determined interface 6.

A result of the verification in S1320 indicates that the status register 63 has the first value, the memory controller 5 may transmit the special command to the memory device 7 (S1330).

A result of the verification in S1320 indicates that the status register 63 does not have the first state, the memory controller 5 returns to S1320 and continues to verify whether the control logic 60 is in the first state.

In S1340, the memory device 7 may save the special command received from the memory controller 5 in the RCD buffer 61. For example, test mode register set (TMRS) sequence information or soft post package repair (SPPR) sequence information may be saved in the RCD buffer 61. In this case, the information regarding each type of the special commands and special operations may be saved in the RCD buffer. For example, when the special command is a test mode register set (TMRS) sequence, the type information indicating the test mode register set (TMRS) sequence may be saved in the first storage of the RCD buffer 61, and test data may be saved in the second storage of the RCD buffer 61. Alternatively, when the special command is a soft post package repair (SPPR) sequence, the type information indicating the soft post package repair (SPPR) sequence may be saved in the first storage of the RCD buffer, and address information of the memory chip for the soft post package repair (SPPR) operation may be saved in the second storage of the RCD buffer.

A size of the RCD buffer 61 may be set in advance considering a length of a total refresh time interval (tRFC tot), system requests, and the like. For example, the RCD buffer 61 size may be pre-set based on a maximum number of special commands which may be performed during the total refresh time considering the retention characteristics of the memory device 7.

In S1350, the memory device 7 may verify whether the RCD buffer 61 is in a FULL state, in which another special command may not be saved.

A result of the verification in S1350 indicates that the control logic 60 is in the FULL state ("yes"), in which another special command may not be saved, the memory device 7 may change the value of the status register 63 to the second value representing the second state, in which the control logic 60 may not receive another special command (S1360).

A result of the verification in S1350 indicates that the control logic 60 is not in the FULL state ("no"), in which the control logic 60 may save another special command, the memory controller 5 may return to S1320 to perform the other special command requested by the host and continue to verify whether the value of the status register 63 is the first value.

State changes of the RCD buffer 61 and the status register 63 before and after the memory device 7 saves the special command are as shown in FIGS. 14A and 14B.

Referring to FIG. 14A, before the memory device 7 receives a special command, the RCD buffer 61 is in an EMPTY state, in which no data is saved, and the status register 63 may have the first value representing the first state, in which the status register 63 may receive a special command. When the memory device 7 then receives a test mode register set (TMRS) sequence and a soft post package repair (SPPR) sequence, the information of each type and special operation of the received sequences may be saved in the RCD buffer 61 in order.

The status register 63 may have different values depending on whether the RCD buffer 61 is in the FULL state. Another special command may be saved until the RCD buffer 61 is verified as having the FULL state. For example, when the RCD buffer 61 may not save another special command, the status register 63 may have the second value representing the second state. In contrast, when the RCD buffer 61 saves another special command (i.e., not in the FULL state), the status register 63 may have the first value indicating the first state.

Meanwhile, the memory device 7 in an exemplary embodiment may execute a plurality of the special commands saved in the RCD buffer 61 during at least one refresh time interval (tRFC) using a "first-in, first out" (FIFO) method, for example.

Referring to FIG. 14B, the RCD buffer 61 is in an EMPTY state, in which no data is saved, and the status register 63 may have the first value representing the first state, in which the status register 63 may receive a special command. When the memory device 7 then receives a test mode register set (TMRS) sequence and a soft post package repair (SPPR) sequence, the information of each type and special operation of the received sequences may be saved in the RCD buffer 61 in order. Further, the RCD buffer 61 may save priority information of special commands. For example, the priority information may be saved in the first storage (byte 0) of the RCD buffer 61 and the command type information may be saved in the second storage (byte 1) of the RCD buffer 61 while special operation information is saved in the third storage (byte 2-byte N).

The status register 63 may have different values depending on whether the RCD buffer 61 is in the FULL state. Another special command may be saved until the RCD buffer 61 is verified as the FULL state. For example, when the RCD buffer 61 may not save another special command (i.e., the RCD buffer 61 may be in the Full state), the status register 63 may have the second value representing the second state. In contrast, when the RCD buffer 61 may save another special command (i.e., the RCD buffer 61 may not be in the Full state), the status register 63 may have the first value indicating the first state.

Meanwhile, the memory device 7 in an exemplary embodiment may execute a plurality of the special commands saved in the RCD buffer 61 according to the priorities thereof during at least one refresh time interval (tRFC).

Figure 15A:
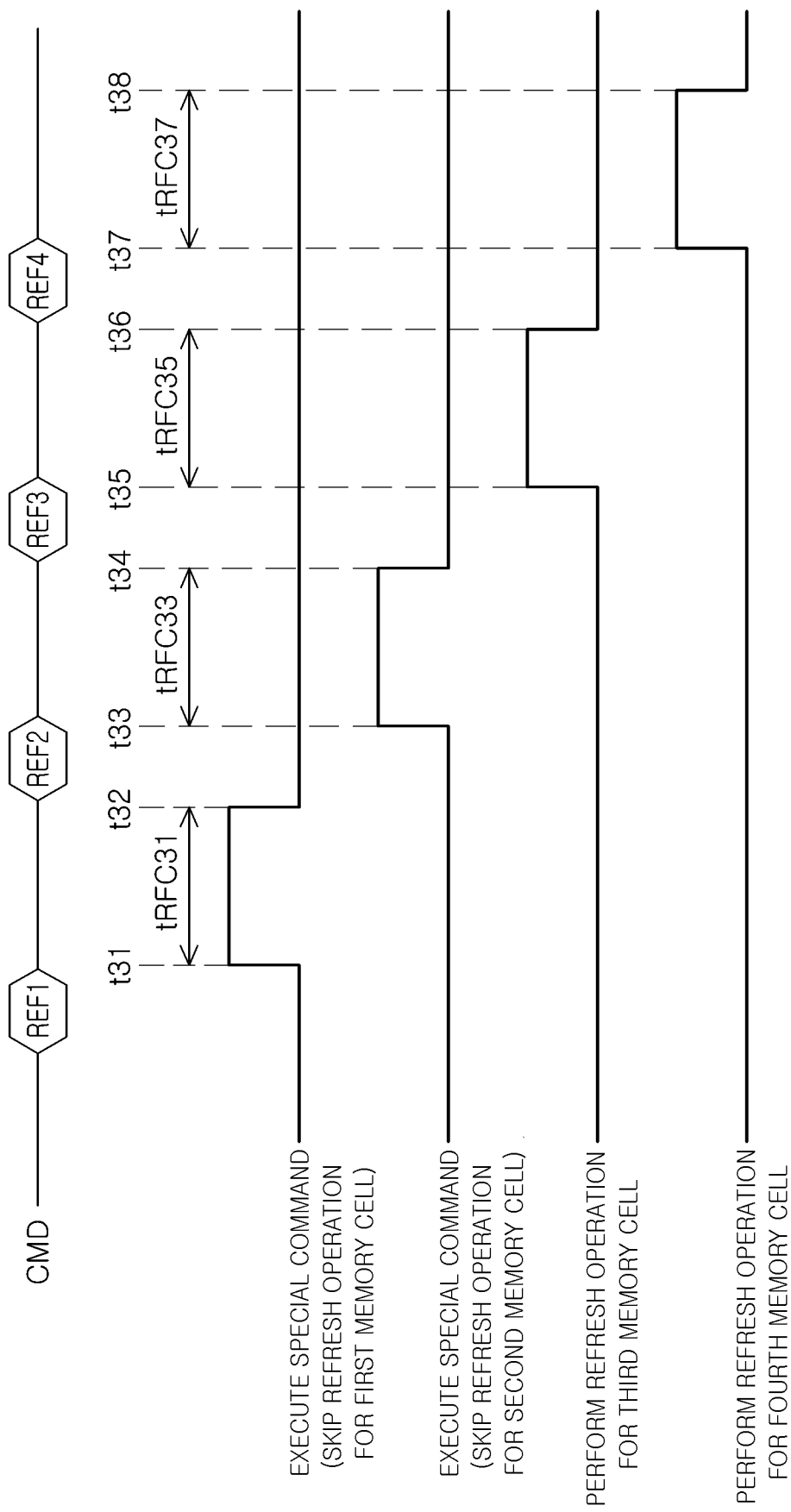
FIGS. 15A and 15B are diagrams illustrating a method of a memory device according to an exemplary embodiment for carrying out a special command.
Figure 15B:
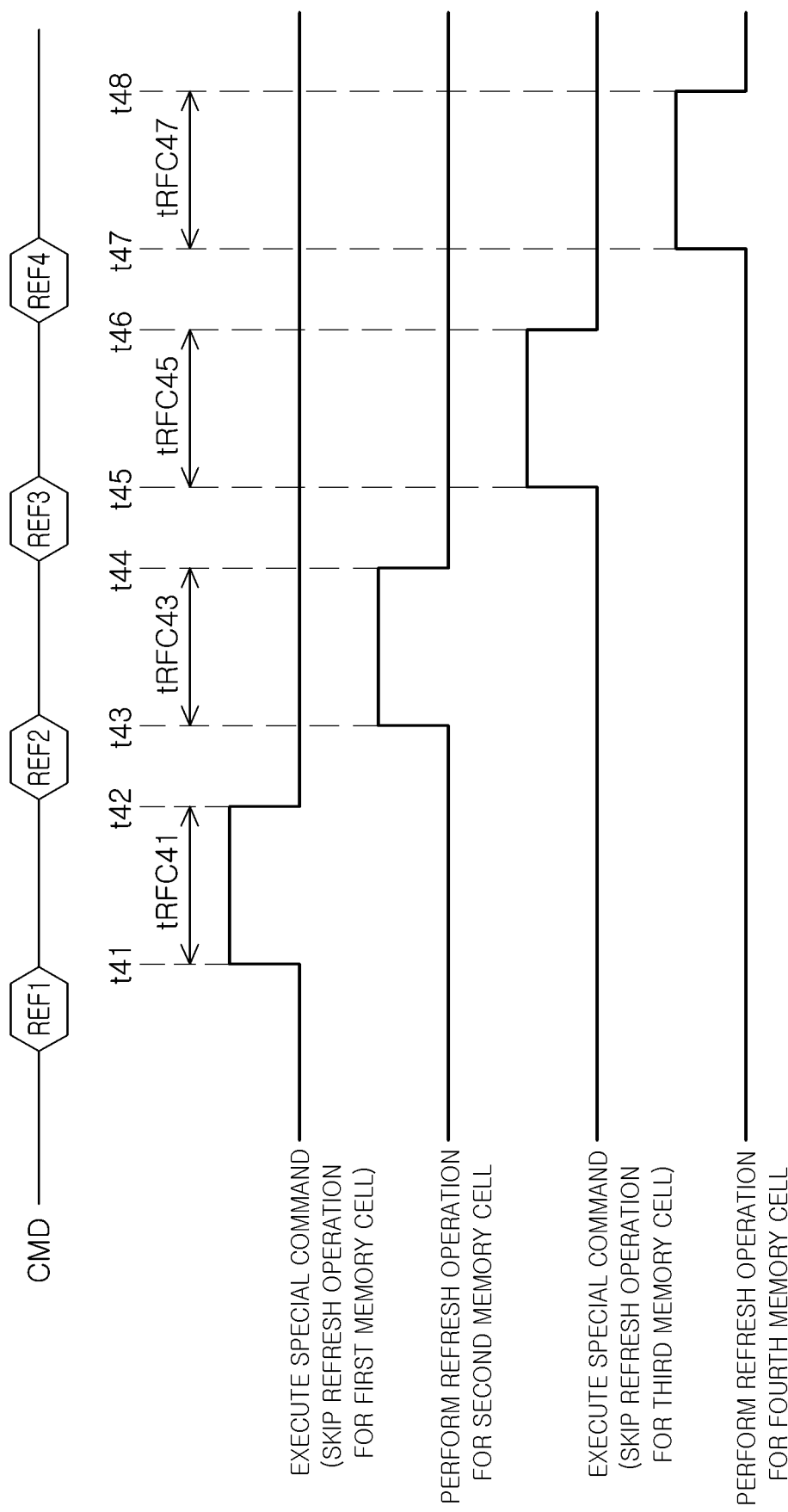

FIGS. 15A and 15B are diagrams illustrating a method of a memory device according to an exemplary embodiment for carrying out a special command.

In an exemplary embodiment, the memory device 7 may continuously execute a plurality of special commands and skip a refresh operation corresponding to a certain refresh time interval (tRFC), during which the special commands have been performed. For example, referring to FIG. 15A, the memory device 7 may execute a first special command saved in the RCD buffer 61 during a refresh time interval (an interval between t31 and t32, tRFC31) for the first memory cell. The memory device 7 may also execute a second special command saved in the RCD buffer 61 during a refresh time interval (an interval between t33 and t34, tRFC 33) for the second memory cell. The first special command may be saved before the second special command or may have a higher priority than the second special command. The memory device 7 may then skip the refresh operations for the first and second memory cells and perform refresh operations for third and fourth memory cells in order.

In an exemplary embodiment, the memory device 7 may discontinuously execute a plurality of special commands. For example, referring to FIG. 15B, the memory device 7 may execute a first special command saved in the RCD buffer 61 during a refresh time interval (an interval between t41 and t42, tRFC41) for the first memory cell. The memory device 7 may also execute a second special command saved in the RCD buffer 61 during a refresh time interval (an interval between t45 and t46, tRFC 45) for a third memory cell. The first special command may be saved before the second special command or may have a higher priority than the second special command. In this case, the refresh operations may be omitted for the first and third memory cells.

Figure 16:
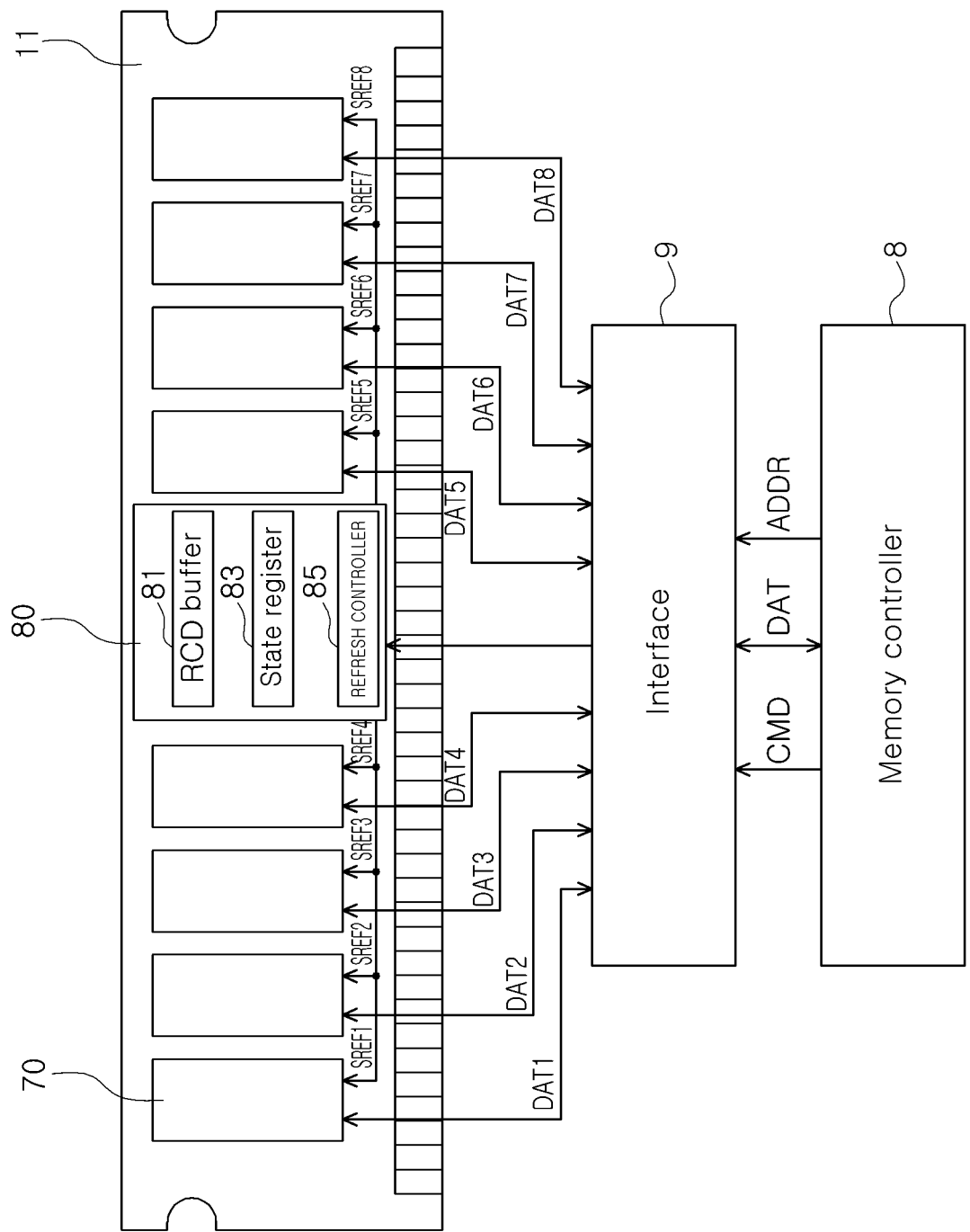
FIGS. 16 and 17 are diagrams illustrating a memory device according to an exemplary embodiment for saving a special command.
Figure 17:
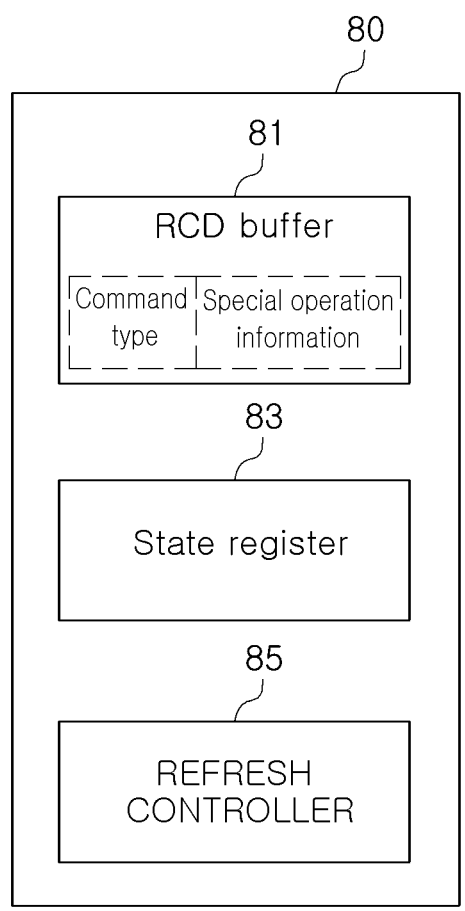

FIG. 16 is a diagram illustrating a memory device according to an exemplary embodiment, and FIG. 17 is a diagram illustrating a constitution of the control logic included in memory device according to an exemplary embodiment.

Referring to both FIGS. 16 and 17, a memory controller 8 may access a memory device 11 through an interface 9. For example, the memory controller 8 may transmit an operation command (CMD) and an address signal (ADDR) to the memory device 11 through the interface 9. Further, the memory controller 8 may exchange various types of data (DAT) with the memory device 11 through the interface 9.

The memory device 11 may include a plurality of memory chips 70 and a control logic 80. The control logic 80 may include a register clock driver (RCD). In an exemplary embodiment, the control logic 80 may include an RCD buffer 81 for saving a special command received from the memory controller 8 and a status register 83 indicating a state of the control logic 80. The control logic 80 may further include a refresh controller 85 for controlling a self-refresh operation. The refresh controller 85 may generate a self-refresh initiation command (SREF) and a self-refresh termination command (SREFX), and transfer the same to a plurality of the memory chips 70 to control the self-refresh operations.

The interface 9 may be designed to access to the status register 83 and the RCD buffer 81 of the control logic 80. In some examples, the interface 9 may include a system management bus (SMBus) or the like.

A method for saving a special command in the RCD buffer 81 may be the same as previously described with reference to FIGS. 8 to 10B, and thus, detailed descriptions thereof will be omitted. Hereinafter, a method of the memory device for executing a special command in an exemplary embodiment will be described with reference to FIGS. 18A and 18B.

Figure 18A:
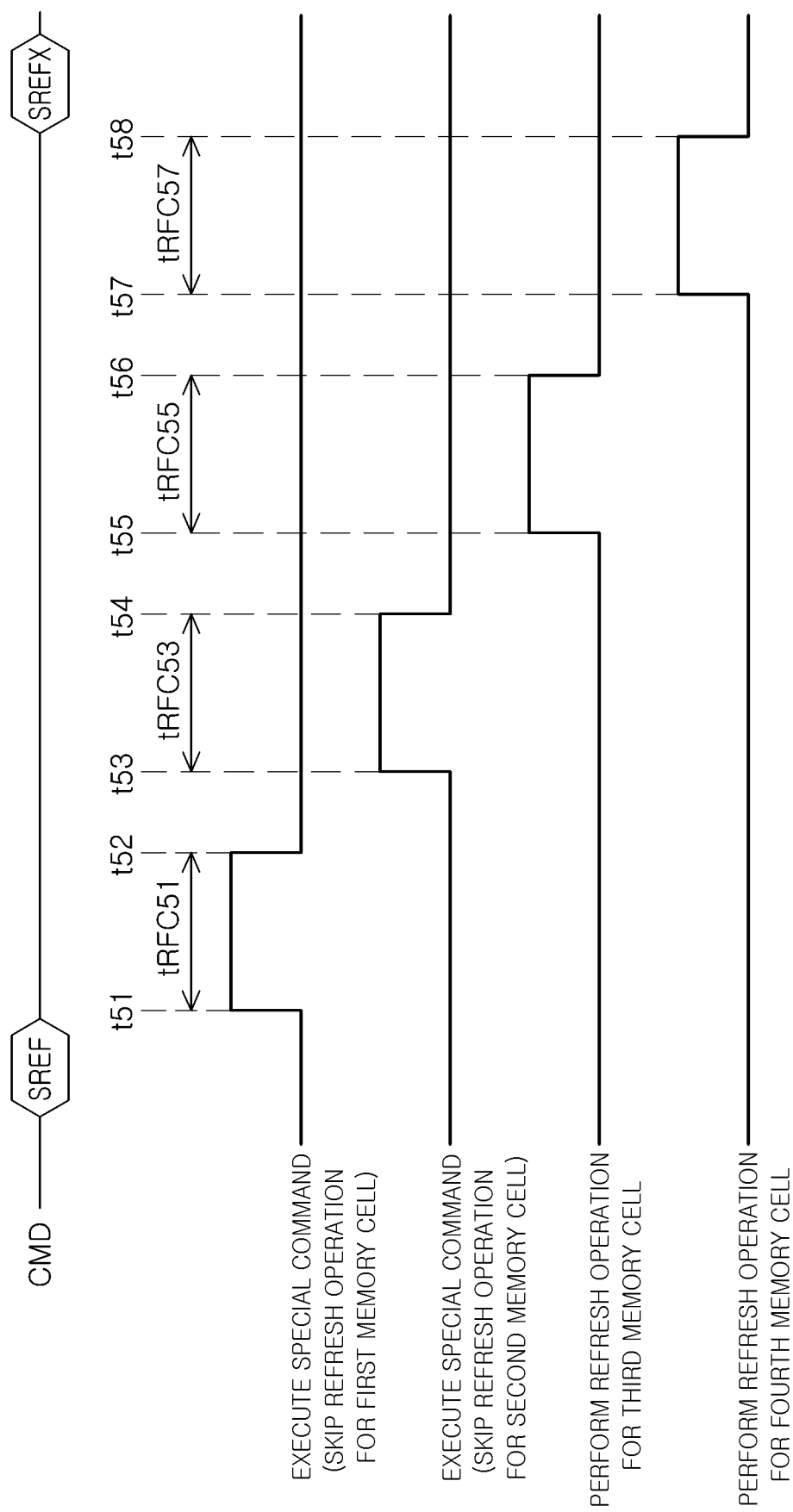
FIGS. 18A and 18B are diagrams illustrating a method of a memory device according to an exemplary embodiment for carrying out a special command.
Figure 18B:
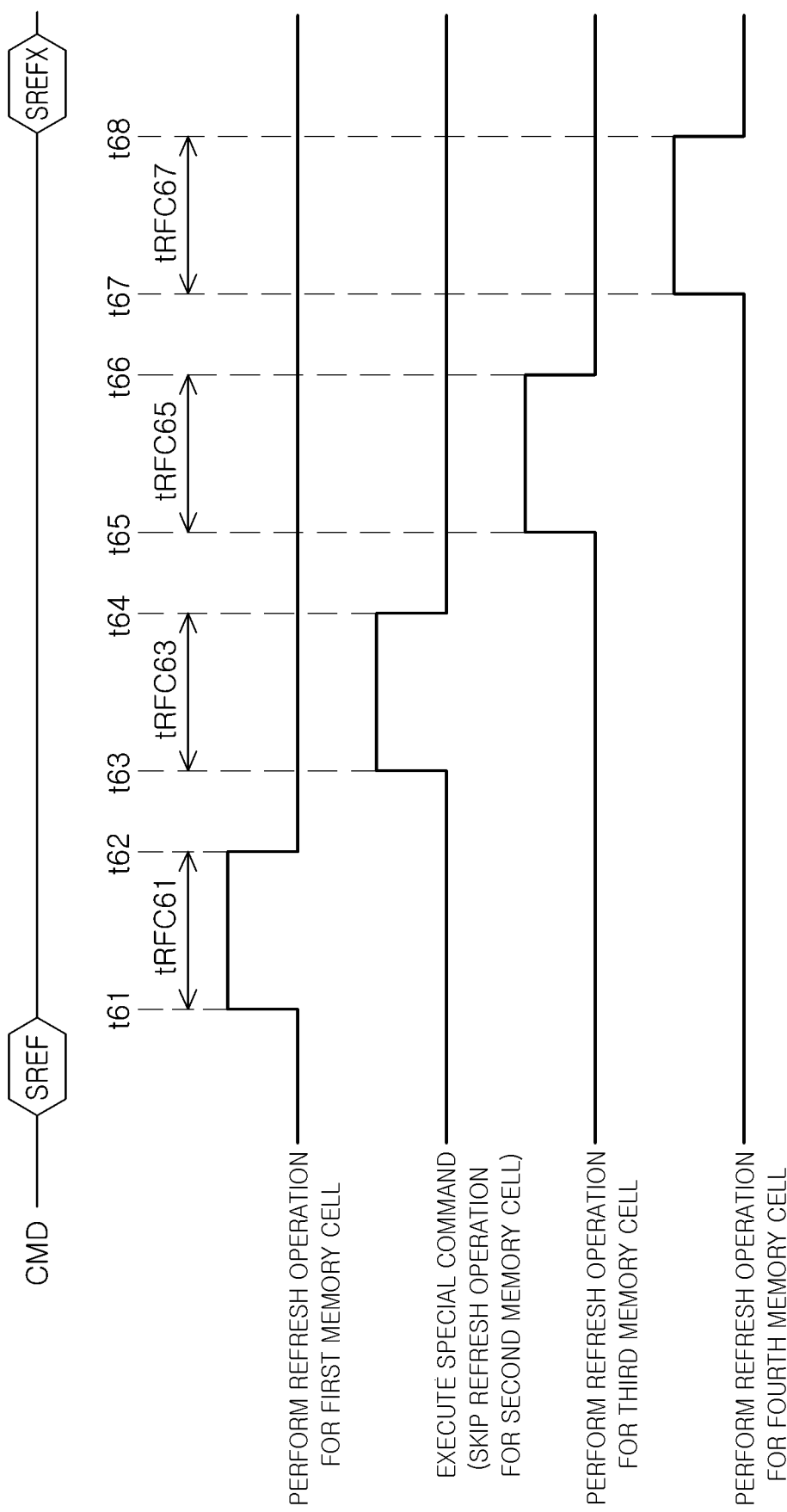

FIGS. 18A and 18B are diagrams illustrating a method of a memory device according to an exemplary embodiment for executing a special command.

Referring to FIG. 18A together with FIG. 17 for convenience of description, the memory device 11 may execute one or more special commands during a self-refresh time interval between the self-refresh initiation command (SREF) and the self-refresh termination command (SREFX). For example, the memory device 11 may execute a first special command saved in the RCD buffer 81 during a refresh time interval (an interval between t51 and t52, tRFC51) for the first memory cell. When the first special command is performed on the first memory cell, a refresh operation is skipped on the first memory cell for the interval tRFC51. The memory device 11 may also execute a second special command saved in the RCD buffer 81 during a refresh time interval (an interval between t53 and t54, tRFC53) for the second memory cell. When the second special command is performed on the second memory cell, a refresh operation is skipped on the second memory cell for the interval tRFC53. The memory device 11 may skip refresh operations for the first and second memory cells and carry out refresh operations for third and fourth memory cells in order.

Referring to FIG. 18B, the memory device 11 may execute a special command saved in the RCD buffer 81 during a refresh time interval (an interval between t63 and t64, tRFC63) for the second memory cells through command scheduling. Consequently, the memory device 11 may carry out the refresh operation for the first memory cell, the special operation for the second memory cell, the refresh operations for the third and fourth memory cells in order.

Figure 19:
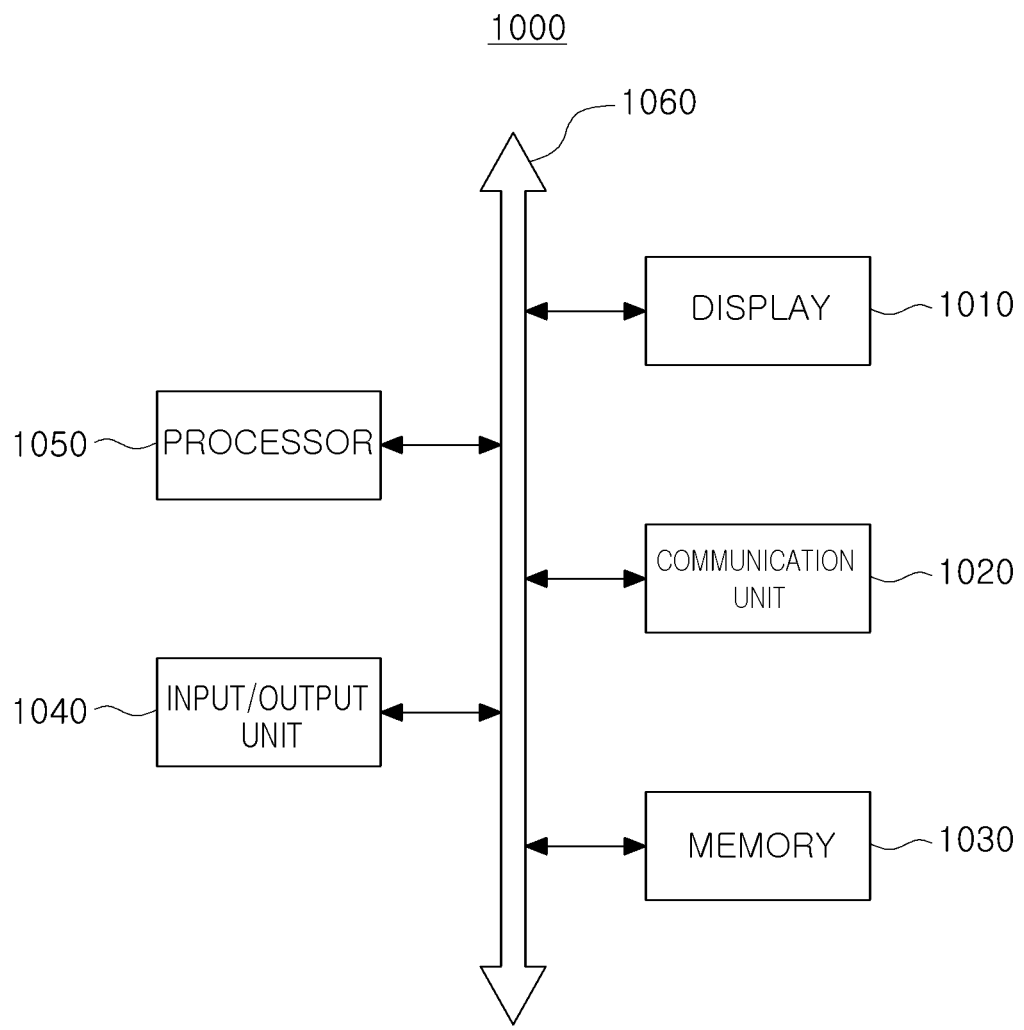
FIG. 19 is a block diagram simply illustrating an electronic device including a memory device according to an exemplary embodiment.

FIG. 19 is a block diagram illustrating an electronic device including a memory device according to an exemplary embodiment.

The electronic device 1000 according to an exemplary embodiment illustrated in FIG. 19 may include a display 1010, a communication unit 1020, a memory 1030, a processor 1050, input/output unit 1040, and the like. The elements such as the display 1010, the communication unit 1020, the memory 1030, the processor 1050, the input/output unit 1040, and the like may communicate with each other through a bus 1060. The electronic device 1000 may further include a power device, a port, and the like, other than those elements mentioned above.

The processor 1050 may perform a certain arithmetic operation or a command, a task, and the like. The processor 1050 may be a central processing unit (CPU), a microprocessor unit (MCU), an application processor, or the like, and may communicate with other constitutional elements such as the display 1010, the communication unit 1020, the memory 1030, the input/output unit 1040, and the like.

The memory 1030 included in the electronic device 1000 illustrated in FIG. 19 may include the memory device according to the various exemplary embodiments of the present disclosure. As an example, the memory 1030 may operate according to the various exemplary embodiments with reference to FIGS. 1 to 18B. The memory 1030 may save, print or delete data in response to an operation command delivered from the processor 1040. Further, the memory 1030 may receive a special command requested by a host and perform the same during a pre-determined refresh time interval (tRFC) while the electronic device 1000 is being run-time operated.

The memory device according to the exemplary embodiments of the present disclosure may execute a special command received from a memory controller in a run-time environment, thereby minimizing a time required for carrying out a special operation and improving efficiency.

Further, the memory device according to the exemplary embodiments may minimize data loss by scheduling refresh time intervals during which the special commands are performed.

The memory device according to the exemplary embodiments may be widely used in all fields which require performance of the special operations.

The various, advantages and beneficial effects of the present disclosure are not limited to the above descriptions and may be more easily understood by detailed descriptions of the exemplary embodiments.

The various and advantageous advantages and effects of the present disclosure may be not limited to the above description, and may be more easily understood in the course of describing a specific embodiment of the present disclosure.

While the present disclosure has been shown and described with reference to example embodiments thereof, it will be apparent to those skilled in the art that modifications and variations could be made thereto without departing from the scope of the present disclosure as defined by the appended claims.

What is claimed is:

1. A memory device, comprising:
a plurality of memory chips configured to write and read data in response to a control command and an address signal; and
a control logic circuit configured to transfer the control command and the address signal to the plurality of the memory chips, and receive a first command from a memory controller to perform a first operation, different from a refresh operation, on at least one of a plurality of the memory chips,
wherein the control logic circuit, in response to a refresh command, transmits the first command to at least one of a plurality of the memory chips and performs the first operation during a pre-determined refresh time interval without carrying out the refresh operation.

2. The memory device of claim 1,
wherein the control logic circuit comprises:
a register clock driver (RCD) buffer configured to save the first command; and
a status register configured to save a value indicating whether the RCD buffer is in a state of being allowed to receive the first command.

3. The memory device of claim 2,
wherein the RCD buffer saves information of a command type of the first command and information of the first operation.

4. The memory device of claim 3,
wherein the control logic circuit is configured to set a size of the RCD buffer according to the command type of the first command.

5. The memory device of claim 2,
wherein when a first value is saved in the status register, the RCD buffer is is allowed to save the first command, and when a second value different from the first value is saved in the status register, the RCD buffer is not allowed to save the first command.

6. The memory device of claim 5,
wherein the control logic circuit updates the value of the status register to be the second value in response to receiving the first command from the memory controller.

7. The memory device of claim 5,
wherein the control logic circuit updates the value of the status register to be the first value in response to transmitting the first command to the plurality of the memory chips.

8. The memory device of claim 7,
wherein when the first value is saved in the status register, the control logic circuit carries out a refresh operation in response to a refresh command received from the memory controller.

9. The memory device of claim 1,
wherein the control logic circuit skips the refresh operation during the pre-determined refresh time interval.

10. The memory device of claim 1,
wherein the first operation comprises at least one of a test mode register set (TMRS) sequence and a soft post package repair (SPPR) sequence for the plurality of the memory chips.

11. A memory device, comprising:
a plurality of memory chips including a plurality of memory cells connected to a plurality of row lines and a plurality of column lines; and
a control logic circuit configured to transmit a first command for performing a first operation of inputting/outputting data for the plurality of the memory cells in a first state and perform a second operation of repairing at least one defective memory cell among the plurality of the memory cells in a second state,
wherein the control logic circuit, in the first state, receives a second command for carrying out the second operation from a memory controller and, in the second state, transmits the second command to the plurality of the memory chips.

12. The memory device of claim 11,
wherein the control logic circuit, in response to a refresh command, transmits the second command to the plurality of the memory chips and performs the second operation during a pre-determined refresh time interval for the plurality of the memory chips.

13. The memory device of claim 11,
wherein the control logic circuit includes a register clock driver (RCD) buffer for saving information of a command type of the second command and information of the second operation, received from the memory controller.

14. The memory device of claim 13,
wherein the control logic circuit, in the first state, receives a third command
the RCD buffer further saves priority information for each of the second command and the third command, and
an order of carrying out the first command and the second command is determined based on the priority information of each of the second command and the third command.

15. The memory device of claim 13,
wherein a size of the RCD buffer is determined based on a maximum number of commands to be performed during a total refresh time interval for the plurality of the memory chips according to retention characteristics of the plurality of the memory cells.

16. A memory device, comprising:
a plurality of memory chips; and
a control logic circuit comprising a status register configured to have status information indicating whether the RCD buffer is in a state to receive a first command, a register clock driver (RCD) buffer configured to save the first command according to the status information of the status register, and a refresh controller configured to control a self-refresh operation for the plurality of the memory chips, wherein the control logic circuit performs a first operation of the first command on at least one of the plurality of the memory chips during at least one of a plurality of refresh time intervals of the self-refresh operation.

17. The memory device of claim 16,
wherein the refresh controller is configured to perform the self-refresh operation by generating a first command of initiating the self-refresh operation and a second command of terminating the self-refresh operation and transmitting the first command and the second command to the plurality of the memory chips.

18. The memory device of claim 16,
wherein the first operation comprises at least one of a test mode register set (TMRS) sequence and a soft post package repair (SPPR) sequence, for the plurality of the memory chips.

19. The memory device of claim 16,
wherein the control logic circuit skips a refresh operation during the at least one of the plurality of refresh time intervals.

20. The memory device of claim 16,
wherein the RCD buffer saves information of a command type of the first command and information of the first operation and has a varying size according to the command type of the first command.

* * * * *